US012811108B2

(12) United States Patent
Kim et al.

(10) Patent No.: US 12,811,108 B2
(45) Date of Patent: Nov. 24, 2026

(54) PROCESS GAS PROVIDING APPARATUS AND SUBSTRATE TREATING APPARATUS INCLUDING THE SAME

(71) Applicant: SEMES CO., LTD., Cheonan-si (KR)

(72) Inventors: Tae Sung Kim, Gyeonggi-do (KR); Hyung Joon Kim, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 183 days.

(21) Appl. No.: 18/945,819

(22) Filed: Nov. 13, 2024

(65) Prior Publication Data

US 2025/0201524 A1 Jun. 19, 2025

(30) Foreign Application Priority Data

Dec. 19, 2023 (KR) ........................ 10-2023-0186197

(51) Int. Cl.
*H01J 37/32* (2006.01)

(52) U.S. Cl.
CPC .................... *H01J 37/32449* (2013.01); *H01J 37/32816* (2013.01); *H01J 2237/24585* (2013.01)

(58) Field of Classification Search
CPC ........... H01J 37/32449; H01J 37/32816; H01J 2237/24585; H01J 37/3244; C23C 16/52; C23C 16/45512; C23C 16/50; B08B 5/02; B08B 11/00; H10P 72/0402; H10P 72/0421; F16K 31/004; F16K 51/02
See application file for complete search history.

(56) References Cited

U.S. PATENT DOCUMENTS

| | | | | |
|---|---|---|---|---|
| 5,491,603 A * | 2/1996 | Birang | H10P 72/722 | 361/234 |
| 2005/0221004 A1* | 10/2005 | Kilpela | C23C 16/45544 | 427/248.1 |
| 2013/0085618 A1* | 4/2013 | Ding | C23C 16/52 | 700/282 |
| 2017/0271183 A1* | 9/2017 | Brashear | G05D 11/132 | |
| 2017/0271184 A1* | 9/2017 | Brashear | H10P 72/0604 | |
| 2022/0043440 A1* | 2/2022 | Burke | G05B 23/0283 | |
| 2023/0137552 A1* | 5/2023 | Fratantonio | A61B 5/1112 | 340/539.13 |

FOREIGN PATENT DOCUMENTS

| | | | |
|---|---|---|---|
| CN | 101702940 | * | 5/2010 |
| CN | 101164029 | * | 6/2011 |
| KR | 10-2010-0106532 A | | 10/2010 |
| KR | 10-2011-0019376 A | | 2/2011 |
| KR | 10-2015-0044934 A | | 4/2015 |

* cited by examiner

*Primary Examiner* — Alexander Markoff
(74) *Attorney, Agent, or Firm* — Harness, Dickey & Pierce, P.L.C.

(57) ABSTRACT

Disclosed are a process gas providing apparatus that optimizes mixing of process gases in consideration of characteristics based on types of the process gases, and a substrate treating apparatus including the same. The process gas providing apparatus of the substrate treating apparatus includes: a mass flow controller (MFC) configured to control a flow rate of the process gas; and an MFC controller configured to control a settling time of the mass flow controller, wherein the MFC controller is configured to control the settling time based on a type of the process gas.

20 Claims, 14 Drawing Sheets

100

PROCESS GAS PROVIDING APPARATUS AND SUBSTRATE TREATING APPARATUS INCLUDING THE SAME

CROSS-REFERENCE TO RELATED APPLICATION

This application claims priority from Korean Patent Application No. 10-2023-0186197 filed on Dec. 19, 2023 in the Korean Intellectual Property Office, and all the benefits accruing therefrom under 35 U.S.C. 119, the contents of which in its entirety are herein incorporated by reference.

BACKGROUND

Field

The present disclosure relates to a process gas providing apparatus applied to equipment for treating a substrate using plasma, and a substrate treating apparatus including the same.

Description of Related Art

When treating a substrate using plasma, process gas may be used to generate the plasma. In this regard, depending on a process recipe, several types of process gases may be supplied simultaneously to a process chamber.

When the several types of process gases are supplied thereto simultaneously, proper mixing and flow uniformity of the process gases are required to increase a yield of a semiconductor product. However, since characteristics based on the types of the process gases are not considered in the prior art, there is a problem that the mixing and flow uniformity of the process gases are poor.

SUMMARY

A technical purpose to be achieved in accordance with the present disclosure is to provide a process gas providing apparatus that optimizes mixing of process gases in consideration of characteristics based on types of the process gases, and a substrate treating apparatus including the same.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

A substrate treating apparatus according to some embodiments of the present disclosure for achieving the above technical purpose incudes a chamber housing having an inner space defined therein for treating a substrate therein; a substrate support unit for supporting the substrate thereon; a showerhead unit for injecting process gas into the inner space of the chamber housing; a plasma generation unit for generating plasma for treating the substrate using the process gas; and a process gas providing apparatus configured to provide the process gas to the showerhead unit, wherein the process gas providing apparatus includes: a mass flow controller (MFC) configured to control a flow rate of the process gas; and an MFC controller configured to control a settling time of the mass flow controller, wherein the MFC controller is configured to control the settling time based on a type of the process gas.

A process gas providing apparatus according to some embodiments of the present disclosure for achieving the above technical purpose is configured to provide process gas to a substrate treating apparatus for treating a substrate using plasma, and includes a first process gas supply for providing first process gas; a second process gas supply for providing second process gas; a first mass flow controller (MFC) connected to the first process gas supply and configured to a flow rate of the first process gas; a second mass flow controller connected to the second process gas supply and configured to a flow rate of the second process gas; a flow rate controller (FRC) connected to the first mass flow controller and the second mass flow controller, wherein when the first process gas and the second process gas are mixed with each other to produce mixed gas in a path between the first and second mass flow controllers and the flow rate controller, wherein the flow rate controller is configured to control a flow rate of the mixed gas and to provide the mixed gas to the substrate treating apparatus; and a MFC controller configured to control each of a settling time of the first mass flow controller and a settling time of the second mass flow controller, wherein the MFC controller is configured to control the settling time of each of the first and second MFCs, based on a type of each of the first and second process gases.

A substrate treating apparatus according to some embodiments of the present disclosure for achieving the above technical purpose incudes a chamber housing having an inner space defined therein for treating a substrate therein; a substrate support unit for supporting the substrate thereon; a showerhead unit for injecting process gas into the inner space of the chamber housing; a plasma generation unit for generating plasma for treating the substrate using the process gas; and a process gas providing apparatus configured to provide the process gas to the showerhead unit, wherein the process gas providing apparatus includes: a first process gas supply for providing first process gas; a second process gas supply for providing second process gas; a first mass flow controller (MFC) connected to the first process gas supply and configured to a flow rate of the first process gas; a second mass flow controller connected to the second process gas supply and configured to a flow rate of the second process gas; a flow rate controller (FRC) connected to the first mass flow controller and the second mass flow controller, wherein when the first process gas and the second process gas are mixed with each other to produce mixed gas in a path between the first and second mass flow controllers and the flow rate controller, wherein the flow rate controller is configured to control a flow rate of the mixed gas and to provide the mixed gas to the showerhead unit; and a MFC controller configured to control each of a settling time of the first mass flow controller and a settling time of the second mass flow controller, wherein the MFC controller is configured to control the settling time of each of the first and second MFCs, based on a type of each of the first and second process gases, wherein the MFC controller is configured to control the settling time of each of the first and second MFCs, based on at least one of a conversion factor and a working pressure of the first and second process gases, wherein the first mass flow controller includes: a first piezoelectric valve for controlling the settling time to a first time; and a second piezoelectric valve for controlling the settling time to a second time.

Specific details of other embodiments are included in the detailed description and drawings.

BRIEF DESCRIPTION OF DRAWINGS

The above and other aspects and features of the present disclosure will become more apparent by describing in detail embodiments thereof with reference to the attached drawings, in which.

DETAILED DESCRIPTIONS

Figure 1:
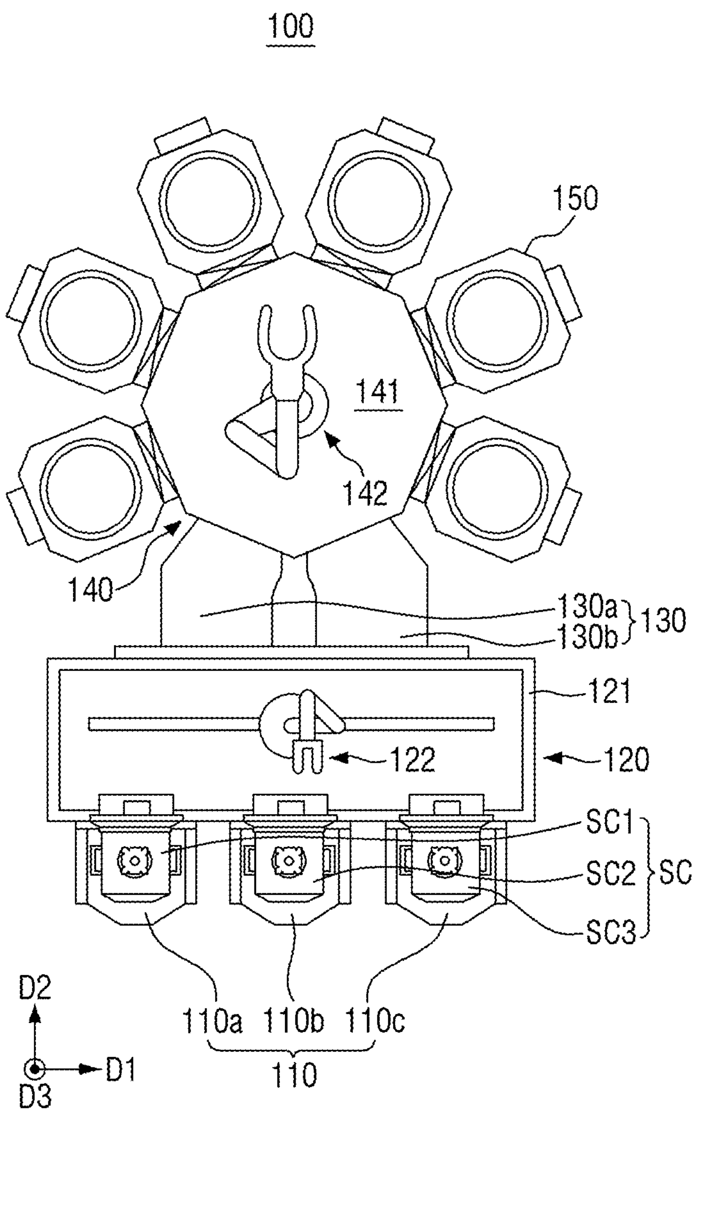
FIG. 1 is a plan view illustrating an internal structure of semiconductor manufacturing equipment according to a first embodiment.

Hereinafter, embodiments of the present disclosure will be described in detail with reference to the attached drawings. Identical reference numerals are used for identical components in the drawings, and redundant descriptions thereof are omitted.

The present disclosure relates to a substrate treating apparatus that treats a substrate using plasma, and to semiconductor manufacturing equipment including a plurality of substrate treating apparatuses. The substrate treating apparatus may include a process gas providing apparatus that provides process gas to generate plasma. The process gas providing apparatus may optimize mixing of process gases in consideration of characteristics based on types of the process gases.

Hereinafter, the substrate treating apparatus and the semiconductor manufacturing equipment including the same will be described first, and then the process gas providing apparatus will be described.

FIG. 1 is a plan view showing an example of an internal structure of semiconductor manufacturing equipment according to a first embodiment.

Figure 2:
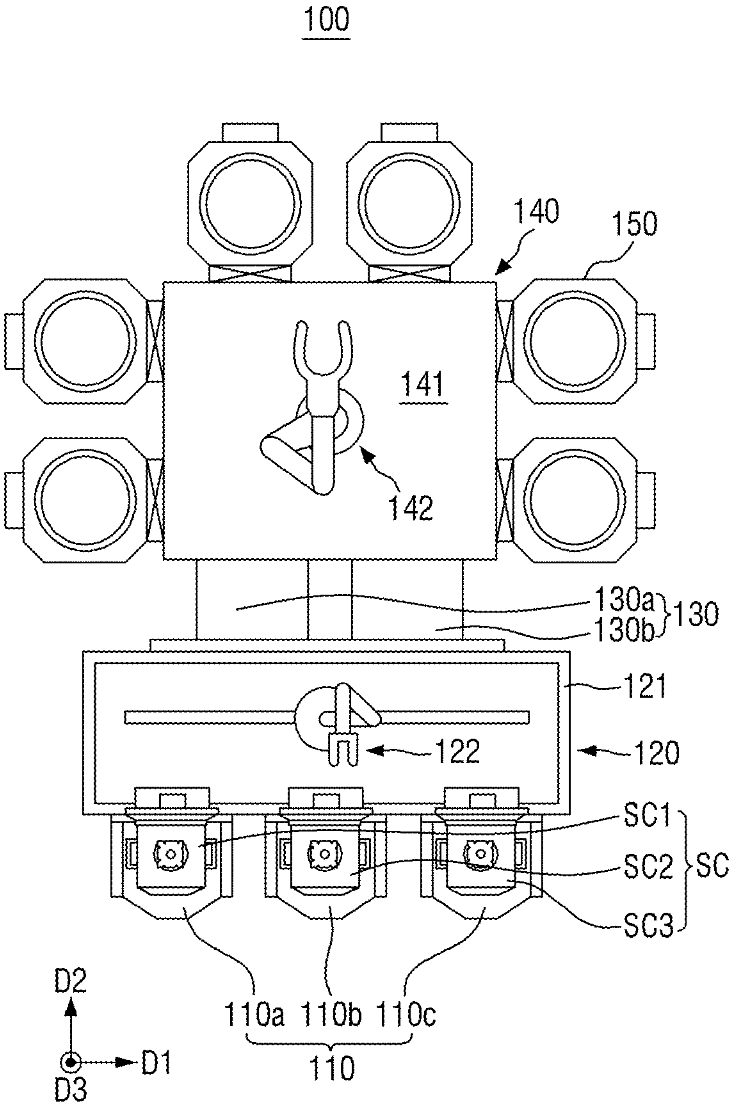
FIG. 2 is a plan view illustrating an internal structure of semiconductor manufacturing equipment according to a second embodiment.

FIG. 2 is a plan view showing an example of an internal structure of semiconductor manufacturing equipment according to a second embodiment.

Figure 3:
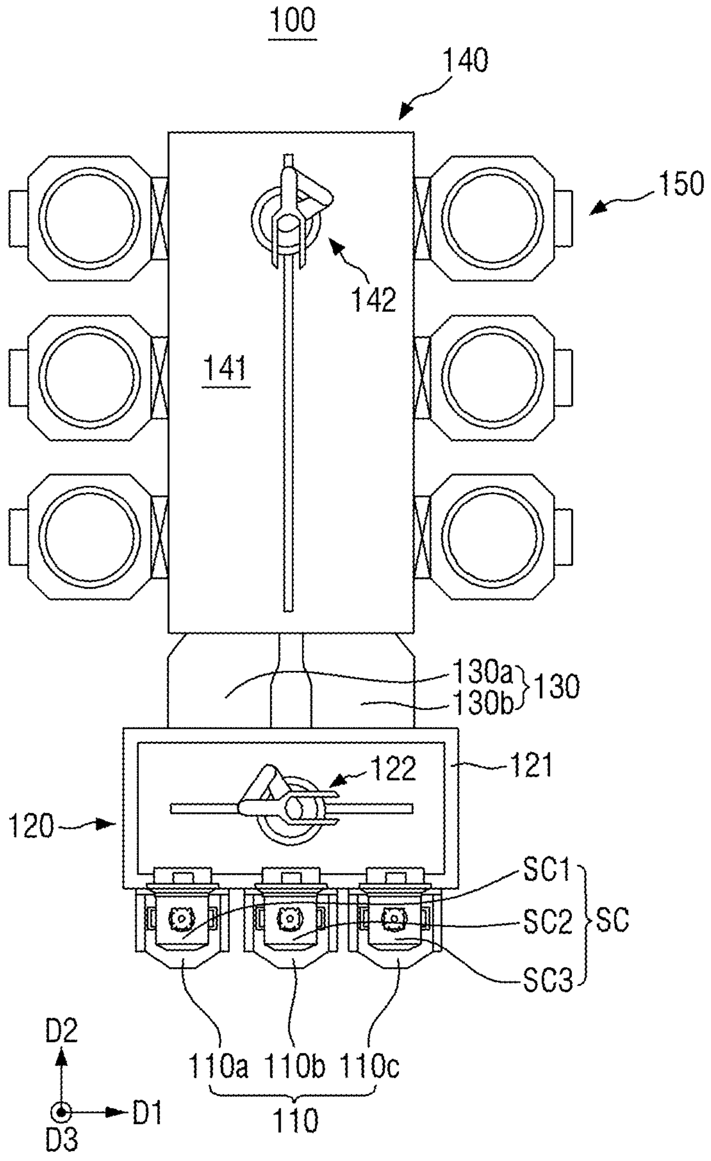
FIG. 3 is a plan view illustrating an internal structure of semiconductor manufacturing equipment according to a third embodiment.

FIG. 3 is a plan view showing an example of an internal structure of semiconductor manufacturing equipment according to a third embodiment.

A first direction D1 and a second direction D2 define a plane in a horizontal direction. For example, the first direction D1 may be a front-back direction, and the second direction D2 may be a left-right direction. Alternatively, the first direction D1 may be the left-right direction, and the second direction D2 may be the front-back direction. The third direction D3 may be a height direction, and is a direction perpendicular to the plane defined by the first direction D1 and the second direction D2. The third direction D3 may be a vertical direction.

According to FIGS. 1 to 3, semiconductor manufacturing equipment 100 may be configured to include a load port module 110, an index module 120, a load lock chamber 130, a transfer module 140, and a process chamber 150

The semiconductor manufacturing equipment 100 is a system that processes a substrate using an etching process, a cleaning process, a deposition process, etc. The semiconductor manufacturing equipment 100 may include one process chamber. However, embodiments of the present disclosure are not limited thereto, and the semiconductor manufacturing equipment 100 may include a plurality of process chambers. The plurality of process chambers may include process chambers of the same type. However, embodiments of the present disclosure are not limited thereto, and the plurality of process chambers may include process chambers of different types. In a case where the semiconductor manufacturing equipment 100 includes the plurality of process chambers, the semiconductor manufacturing equipment 100 may be embodied as a multi-chamber type substrate treating system.

The load port module 110 is configured such that a container SC containing therein a plurality of substrates may be seated thereon. In this regard, the container SC may be, for example, a FOUP (Front Opening Unified Pod).

The container SC may be loaded or unloaded into or out of the load port module 110. Furthermore, in the load port module 110, the substrate stored in the container SC may be loaded or unloaded into or therefrom.

When a loading or unloading target is the container SC, a container transport apparatus may load or unload the container SC to or out of the load port module 110. More specifically, the container transport apparatus may hold the container SC and seat the container SC on the load port module 110 such that the container SC may be loaded onto the load port module 110. Furthermore, the container transport apparatus may hold the container SC that has been held on the load port module 110 and remove the container SC therefrom such that the container SC may be unloaded from the load port module 110. Although not shown in FIG. 1 to FIG. 3, the container transport apparatus may be an OHT (Overhead Hoist Transporter).

When the loading or unloading target is the substrate, a first conveying robot 122 may load or unload the substrate into or out of the container SC seated on the load port module 110. Regarding the unloading of the substrate, when the container SC has been placed on the load port module 110, the first conveying robot 122 approaches the load port module 110 and may then take out the substrate out of the container SC. Regarding the loading of the substrate, when treatment of the substrate has been completed within the process chamber 150, the first conveying robot 22 may take out the substrate out of the load lock chamber 130 and may then place the substrate into the container SC.

The load port modules 110 may be respectively positioned at multiple positions and may be disposed in front of the index module 120. For example, three load port modules 110*a*, 110*b*, and 110*c*, including the first load port module 110*a*, the second load port module 110*b*, and the third load port module 110*c*, may be disposed in front of the index module 120.

When the load port modules 110 are positioned at the multiple positions, respectively, and in front of the index module 120, the containers SC respectively seated on the load port modules may contain different types of objects, respectively. For example, when a first load port module 110*a*, a second load port module 110*b*, and a third load port module 110*c* are disposed in front of the index module 120, the first container SC1 seated on the first load port module 110*a* may contain a wafer-type sensor, the second container SC2 seated on the second load port module 110*b* may contain a substrate, i.e., a wafer, and the third container SC3 seated on the third load port module 110*c* may contain a consumable part such as a focus ring and an edge ring.

However, the present embodiment is not limited thereto. The containers SC respectively seated on the different load port modules may contain objects of the same type, respectively. Alternatively, the containers seated on some load port modules among the plurality of load port modules may contain objects of the same type, respectively, while the containers seated on the other load port modules among the plurality of load port modules may contain objects of different types, respectively.

The index module 120 may be disposed between the load port module 110 and the load lock chamber 130, and may be embodied as an interface so that a substrate may be transferred between the container SC on the load port module 110 and the load lock chamber 130 through the interface.

The index module 120 may include a first module housing 121 and the first conveying robot 122. The first conveying robot 122 may be disposed inside the first module housing 121, and may convey the substrate between the load port module 110 and the load lock chamber 130. The first module housing 121 may have an internal environment as an atmospheric pressure environment created therein, and the first conveying robot 122 may operate in the atmospheric pressure environment. A single first conveying robot 122 may be included in the first module housing 121. However, embodiments of the present disclosure are not limited thereto, and a plurality of first conveying robots 122 may be included in the first module housing 121.

Although not shown in FIG. 1 to FIG. 3, the index module 120 may include a buffer chamber. The buffer chamber may temporarily store therein an untreated substrate before conveying the same to the load lock chamber 130. Furthermore, the buffer chamber may temporarily store therein an already-treated substrate before conveying the same to the container SC loaded on the load port module 110. The buffer chamber may be disposed on a side wall other than a side wall adjacent to the load port module 110 or a side wall adjacent to the load lock chamber 130. However, the present disclosure is not limited thereto, and the buffer chamber may be disposed on the side wall adjacent to the load port module 110. Alternatively, the buffer chamber may be disposed on the side wall adjacent to the load lock chamber 130.

In this embodiment, a front end module (FEM) may be disposed on one side of the load lock chamber 130. The front end module (FEM) may include the load port module 110 and the index module 120, and may be embodied as an Equipment Front End Module (EFEM) in one example.

As described above, a plurality of load port modules 110 may be provided in the semiconductor manufacturing equipment 100. Referring to the examples of FIG. 1 to FIG. 3, the plurality of load port modules may be arranged in a horizontal direction D1. However, the present disclosure is not limited thereto, and the plurality of load port modules may be stacked in the vertical direction D3. In a configuration where the plurality of load port modules are stacked in the vertical direction, the front end module may be provided as a vertical stack type EFEM.

The load lock chamber 130 may function as a buffer chamber between an input port and an output port in the semiconductor manufacturing equipment 100. That is, the load lock chamber 130 may temporarily store therein an untreated substrate or a treated substrate while being disposed between the load port module 110 and the process chamber 150. Although not shown in FIGS. 1 to 3, the load lock chamber 130 may include a buffer stage that temporarily stores the substrate therein.

A plurality of load lock chambers 130 may be disposed between the index module 120 and the transfer module 140. For example, two load lock chambers 130*a* and 130*b*, such as a first load lock chamber 130*a* and a second load lock chamber 130*b*, may be disposed between the index module 120 and the transfer module 140.

The plurality of load lock chambers may be arranged in the same direction as the arrangement direction of the plurality of load port modules. Referring to examples of FIG. 1 to FIG. 3, the first load lock chamber 130*a* and the second load lock chamber 130*b* may be arranged in the same direction as the arrangement direction of the three load port modules 110*a*, 110*b*, and 110*c*, that is, in the horizontal direction D1 while being disposed between the index module 120 and the transfer module 140. The first load lock chamber 130*a* and the second load lock chamber 130*b* may be provided in a mutually-symmetrical single-layer structure in which the first load lock chamber 130*a* and the second load lock chamber 130*b* are arranged to be spaced apart in the horizontal direction in the same layer.

However, the present embodiment is not limited thereto. The plurality of load lock chambers may be arranged in a direction different from the arrangement direction of the plurality of load port modules. The first load lock chamber 130*a* and the second load lock chamber 130*b* may be arranged in a direction, that is, the vertical direction D3 different from the arrangement direction of the three load port modules 110*a*, 110*b*, and 110*c* while being disposed between the index module 120 and the transfer module 140. The first load lock chamber 130*a* and the second load lock chamber 130*b* may be provided in a vertical stack structure in which the first load lock chamber 130*a* and the second load lock chamber 130*b* are arranged spaced apart from each other in the vertical direction.

Among the first load lock chamber 130*a* and the second load lock chamber 130*b*, one load lock chamber may temporarily store therein an untreated substrate to be conveyed from the index module 120 to the transfer module 140. The other load lock chamber among the first load lock chamber 130*a* and the second load lock chamber 130*b* may temporarily store therein a treated substrate to be conveyed from the transfer module 140 to the index module 120. However, the present disclosure is not limited thereto, and each of the first load lock chamber 130*a* and the second load lock chamber 130*b* may perform both the role of temporarily storing therein the untreated substrate and the role of temporarily storing therein the treated substrate.

The load lock chamber 130 may change an inner space thereof into either a vacuum environment or an atmospheric pressure environment using a gate valve, etc. In detail, when the first conveying robot 122 of the index module 120 loads the substrate into the load lock chamber 130 or the first conveying robot 122 unloads the substrate from the load lock chamber 130, the load lock chamber 130 may change the inner space thereof into an environment identical to or similar to the internal environment of the index module 120. Furthermore, when the second conveying robot 142 of the transfer module 140 loads the substrate into the load lock chamber 130 or the second conveying robot 142 unloads the substrate from the load lock chamber 130, the load lock chamber 130 may change the inner space thereof into an environment identical or similar to the internal environment of the transfer module 140. Thus, the load lock chamber 130 may prevent the internal pressure state of the index module 120 or the internal pressure state of the transfer module 140 from changing.

The transfer module 140 may be disposed between the load lock chamber 130 and the process chamber 150, and may be embodied as an interface so that the substrate may be transferred between the load lock chamber 130 and the process chamber 150 through the interface.

The transfer module 140 may include a second module housing 141 and the second conveying robot 142. The second conveying robot 142 may be disposed inside the second module housing 141 and may convey the substrate between the load lock chamber 130 and the process chamber 150. The second module housing 141 may have a vacuum environment as an internal environment thereof, and the second conveying robot 142 may operate in the vacuum environment. A single second conveying robot 142 may be provided in the second module housing 141. However, embodiments of the present disclosure are not limited thereto and a plurality of second conveying robots 142 may be provided in the second module housing 141.

The transfer module 140 may be connected to the plurality of process chambers 150. For this purpose, the second module housing 141 may include a plurality of sides, and the second conveying robot 142 may be configured to freely pivot around each of the sides of the second module housing 141 so that the second conveying robot 142 may load the substrate into each of the plurality of process chambers 150 or unload the substrate from each of the plurality of process chambers 150.

The process chamber 150 serves to treat the substrate. The process chamber 150 may treat the substrate when an untreated substrate has been provided thereto, and may provide the treated substrate to the load lock chamber 130 through the transfer module 140. A more detailed description of the process chamber 150 will be set forth later.

When the semiconductor manufacturing equipment 100 includes the plurality of process chambers, the semiconductor manufacturing equipment 100 may be formed as a structure having a cluster platform. For example, the plurality of process chambers may be arranged in a cluster manner around the transfer module 140 as shown in the example of FIG. 1. However, the present embodiment is not limited thereto. In the case where the semiconductor manufacturing equipment 100 includes the plurality of process chambers, the semiconductor manufacturing equipment 100 may be formed as a structure having a quad platform. For example, the plurality of process chambers may be arranged in a quad manner around the transfer module 140 as shown in the example of FIG. 2. Alternatively, in the case where the semiconductor manufacturing equipment 100 includes the plurality of process chambers, the semiconductor manufacturing equipment 100 may be formed as a structure having an in-line platform. For example, the plurality of process chambers may be arranged in an in-line manner around the transfer module 140 as shown in the example of FIG. 3, in which two arrangements of the process chambers may be respectively disposed on both opposing sides of the transfer module 140, and the different process chambers in the two arrangements may face each other in a corresponding manner with each other, and each of the two arrangements may extend in a line.

Although not shown in FIG. 1 to FIG. 3, the semiconductor manufacturing equipment 100 may further include a control device. The control device is configured to control an operation of each of the modules constituting the semiconductor manufacturing equipment 100. For example, the control device may be configured to control the substrate convey of the first conveying robot 122 or the second conveying robot 142, control the internal environmental change of the load lock chamber 130, and control the overall substrate treating process of the process chamber 150

The control device may include a processor that executes control of each of the components constituting the semiconductor manufacturing equipment 100, a network over which the components communicate with each other in a wired manner or wirelessly, one or more instructions related to a function or an operation for controlling each of the components, a memory means that stores therein treating recipes including instructions, various data, etc. The control device may further include a user interface including an input means for an operator to perform command input manipulation, etc. to manage the semiconductor manufacturing equipment 100, and an output means for visualizing and displaying the operating status of the semiconductor manufacturing equipment 100. The control device may be embodied as a computing device for data processing and analysis, command transmission, etc.

The instructions may be provided in a form of a computer program or an application. The computer program may be stored in a computer-readable recording medium containing one or more instructions. The instructions may include codes generated by a compiler, codes that may be executed by an interpreter, etc. The memory means may be embodied as one or more storage media selected from flash memory, HDD, SSD, card type memory, RAM, SRAM, ROM, EEPROM, PROM, magnetic memory, magnetic disk, and optical disk.

Next, the process chamber 150 is described. The process chamber 150 may be made of alumite having an anodic oxide film formed on a surface thereof, and the inner space of the process chamber may be airtight. The plurality of process chambers 150 may be disposed within the semiconductor manufacturing equipment 100, and the plurality of process chambers may be arranged around the transfer module 140 so as to be spaced apart from each other. However, the present disclosure is not limited thereto, and a single process chamber 150 may be provided in within the semiconductor manufacturing equipment 100. The process chamber 150 may be provided in a cylindrical shape. However, the present disclosure is not limited thereto and the process chamber 150 may be provided in a shape other than the cylindrical shape.

As described above, the process chamber 150 may treat the substrate. Hereinafter, the process chamber 150 will be defined as a substrate treating apparatus, and an internal structure thereof will be described.

Figure 4:
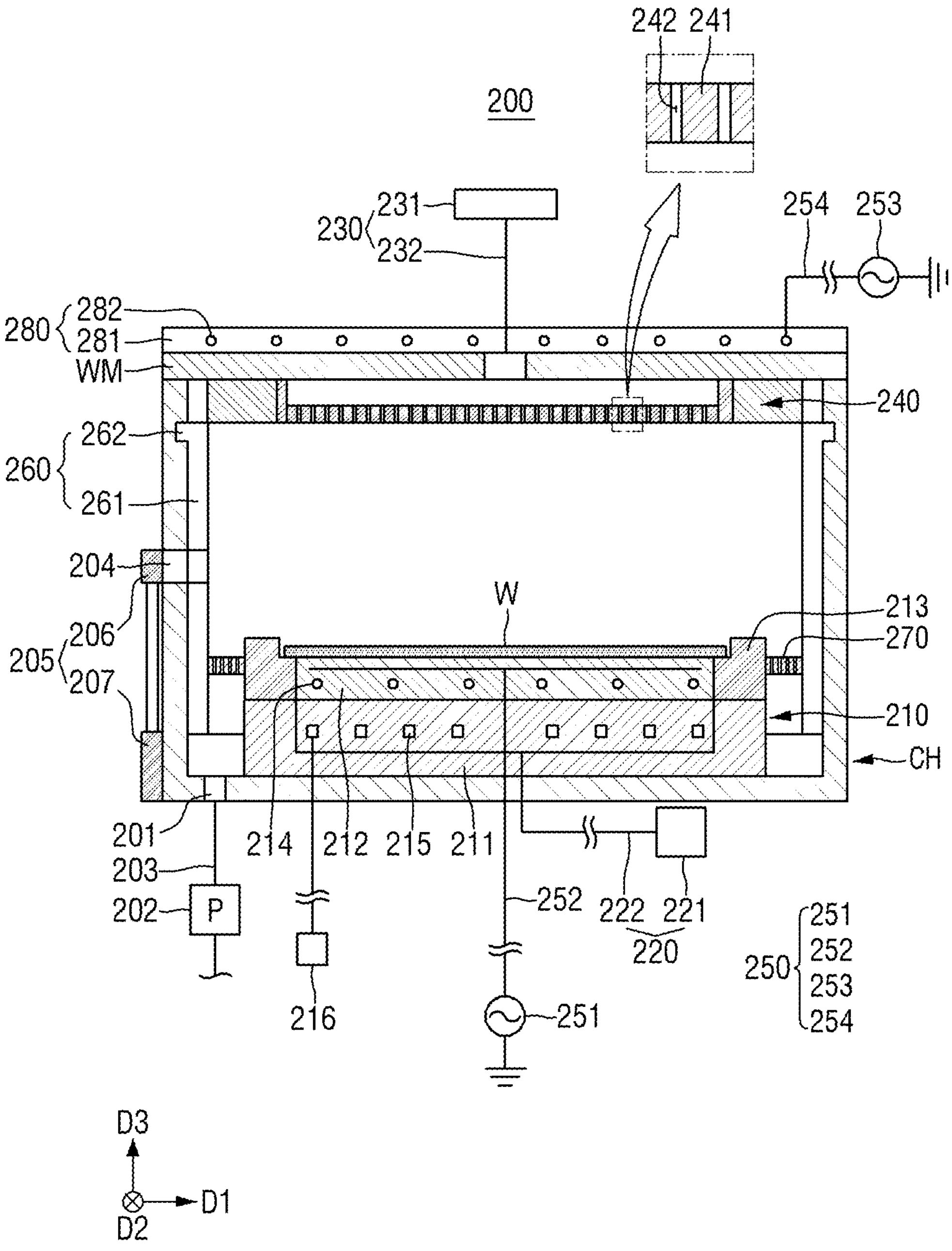
FIG. 4 is a cross-sectional view illustrating an internal structure of a substrate treating apparatus according to a first embodiment.

FIG. 4 is a cross-sectional view showing an example of an internal structure of the substrate treating apparatus according to a first embodiment. According to FIG. 4, a substrate treating apparatus 200 may be configured to include a chamber housing CH, a substrate support unit 210, a cleaning gas supply unit 220, a process gas supply unit 230, a showerhead unit 240, a plasma generation unit 250, a liner unit 260, a baffle unit 270, a window module WM, and an antenna unit 280.

The substrate treating apparatus 200 may treat a substrate W using plasma. The substrate treating apparatus 200 may treat a substrate W in a dry manner. The substrate treating apparatus 200 may treat the substrate W in a vacuum environment, for example. The substrate treating apparatus 200 may treat the substrate W using an etching process. However, the present disclosure is not limited thereto, and the substrate treating apparatus 200 may treat the substrate W using a deposition process or a cleaning process.

The chamber housing CH provides a space where a process for treating the substrate W using plasma, i.e., a plasma process, is performed. The chamber housing CH may be made of alumite having an anodic oxide film formed on its surface, and an inner space thereof may be configured to be airtight. The chamber housing CH may be provided in a cylindrical shape. However, embodiments of the present disclosure are not limited thereto and the chamber housing CH may be provided in other shapes. The chamber housing CH may have an exhaust hole 201 defined in a bottom thereof.

The exhaust hole 201 may be connected to an exhaust line 203 equipped with a pump 202. The exhaust hole 201 may discharge reaction byproducts generated during the plasma process and gases remaining inside the chamber housing CH to the outside out of the chamber housing CH through the exhaust line 203. In this case, the inner space of the chamber housing CH may be depressurized An opening 204 may extend through a side wall of the chamber housing CH. The opening 204 may act as a passage through which the substrate W enters and exits the inside of the chamber housing CH. The opening 204 may be configured to be automatically opened and closed by, for example, a door assembly 205.

The door assembly 205 may be configured to include an outer door 206 and a door driver 207. The outer door 206 may open and close the opening 204 while being disposed on an outer wall of the chamber housing CH. The outer door 206 may be moved in the height direction D3 of the substrate treating apparatus 200 under control of the door driver 207. The door driver 207 may operate using at least one element selected from a motor, a hydraulic cylinder, and a pneumatic cylinder.

The substrate support unit 210 is installed in a lower area of the inner space of the chamber housing CH. The substrate support unit 210 may absorb and support the substrate W using an electrostatic force. For example, the substrate support unit 210 may be embodied as an electrostatic chuck (ESC). However, the present disclosure is not limited thereto, and the substrate support unit 210 may support the substrate W thereon using various other schemes such as vacuum, mechanical clamping, etc.

When the substrate support unit 210 is embodied as the electrostatic chuck (ESC), the substrate support unit 210 may be configured to include a base plate 211 and a dielectric layer 212. The dielectric layer 212 may be disposed on the base plate 211 and may adsorb and support the substrate W that is placed thereon. The base plate 211 may be made of a material having excellent corrosion resistance and heat resistance. The base plate 211 may be embodied as an aluminum body, for example. The dielectric layer 212 may be made of a ceramic material, for example.

Although not shown in FIG. 4, the substrate support unit 210 may be configured to further include a bonding layer. The bonding layer may bond the base plate 211 and the dielectric layer 212 to each other. The bonding layer may include, for example, a polymer.

A ring structure 213 is provided to surround an outer edge area of the dielectric layer 212. The ring structure 213 may play a role in concentrating ions on the substrate W when the plasma process is performed inside the chamber housing CH. The ring structure 213 may be made of silicon. The ring structure 213 may be embodied, for example, as a focus ring.

Although not shown in FIG. 4, the ring structure 213 may further include an edge ring. The edge ring may be provided under or an outer side of a focus ring. The edge ring may play a role in preventing a side surface of the dielectric layer 212 from being damaged by plasma. The edge ring may be made of an insulating material, for example, ceramic or quartz.

A heating member 214 and a cooling member 215 are provided to maintain the substrate W at a process temperature when the substrate treating process is performed inside the chamber housing CH. The heating member 214 may be installed inside the dielectric layer 212 and may be embodied as a heating wire. The cooling member 215 may be installed inside the base plate 211 and may be embodied as a cooling pipe through which a coolant flows. A cooling device or a chiller 216 may supply the coolant to the cooling member 215. The cooling device 216 may use cooling water as the coolant. However, embodiments of the present disclosure are not limited thereto and helium (He) gas may be used as the coolant. Alternatively, the cooling device 216 may use both the cooling water and helium gas as the coolant. In one example, the heating member 214 may not be disposed inside the substrate support unit 210.

The cleaning gas supply unit 220 provides a cleaning gas onto the dielectric layer 212 or the ring structure 213 to remove foreign substances remaining on the dielectric layer 212 or the ring structure 213. For example, the cleaning gas supply unit 220 may provide nitrogen ($N_2$) gas as the cleaning gas.

The cleaning gas supply unit 220 may include a cleaning gas supply source 221 and a cleaning gas supply pipe 222. The cleaning gas supply pipe 222 may be connected to a space between the dielectric layer 212 and the ring structure 213. The cleaning gas supplied from the cleaning gas supply source 221 may flow to the space between the dielectric layer 212 and the ring structure 213 through the cleaning gas supply pipe 222 to remove the foreign substances remaining on an edge portion of the dielectric layer 212 or an upper portion of the ring structure 213.

The process gas supply unit 230 provides process gas to the inner space of the chamber housing CH. The process gas supply unit 230 may provide process gas to the inner space of the chamber housing CH through a hole extending through an upper cover, that is, the window module WM of the chamber housing CH. However, the present disclosure is not limited thereto, and the process gas supply unit 230 may provide the process gas to the inner space of the chamber housing CH through a hole extending through a side wall of the chamber housing CH.

The process gas supply unit 230 may include a process gas supply source 231 and a process gas supply pipe 232. The process gas supply source 231 may provide gas used to treat the substrate W as the process gas. The process gas supply source 231 may be provided as a single process gas supply source in the substrate treating apparatus 200. However, the present disclosure is not limited thereto and the substrate treating apparatus 200 may include a plurality of process gas supply sources. In a case where the substrate treating apparatus 200 includes the plurality of process gas supply sources 231, the plurality of process gas supply sources 231 may provide the same type of the process gas. However, the present disclosure is not limited thereto and the plurality of process gas supply sources 231 may provide different types of process gases.

The showerhead unit 240 sprays the process gas provided from the process gas supply source 231 to an entire area of the substrate W placed in the inner space of the chamber housing CH. The showerhead unit 240 may be connected to the process gas supply source 231 via the process gas supply pipe 232.

The showerhead unit 240 may be disposed in the inner space of the chamber housing CH and may include a showerhead body 241 and a plurality of gas feeding holes 242. The showerhead body 241 may be made of silicon. However, embodiments of the present disclosure are not limited thereto and the showerhead body 241 may be made of metal. The plurality of gas feeding holes 242 may extend through a surface of the showerhead body 241 in the vertical direction D3. The plurality of gas feeding holes 242 may be spaced apart from each other by a predetermined spacing and may extend through the showerhead body 241. The plurality of gas feeding holes 242 may uniformly inject the process gas to the entire area of the substrate W.

The showerhead unit 240 may be installed within the chamber housing CH so as to face the substrate support unit 210 in the vertical direction D3. The showerhead unit 240 may be constructed to have a diameter larger than that of the dielectric layer 212. However, the present disclosure is not limited thereto. The showerhead unit 240 may be constructed to have the diameter equal to the diameter of the dielectric layer 212. The showerhead unit 240 may be made of silicon. However, the present disclosure is not limited thereto and the showerhead unit 240 may be made of metal.

Although not shown in FIG. 4, the showerhead unit 240 may be divided into a plurality of modules. For example, the showerhead unit 240 may be divided into three modules including a first head module, a second head module, and a third head module. The first head module may be disposed at a position corresponding to or overlapping a center area of the substrate W. The second head module may be disposed to surround an outer edge of the first head module. The second head module may be disposed at a position corresponding to or overlapping a middle area of the substrate W. The third head module may be disposed to surround an outer edge of the second head module. The third head module may be disposed at a position corresponding to or overlapping an edge area of the substrate W.

The plasma generation unit 250 generates plasma from gas remaining in a discharge space. In this regard, the discharge space may be embodied as a portion of the inner space of the chamber housing CH defined between the showerhead unit 240 and the window module WM. Alternatively, the discharge space may be a space defined between the substrate support unit 210 and the showerhead unit 240. When the discharge space is a space defined between the substrate support unit 210 and the showerhead unit 240, the discharge space may be divided into a plasma area and a process area. The plasma area may be positioned on top of the process area.

The plasma generation unit 250 may generate the plasma in the discharge space using an ICP (Inductively Coupled Plasma) source. For example, the plasma generation unit 250 may generate the plasma in the discharge space using the substrate support unit 210 and the antenna unit 280 as a first electrode (lower electrode) and a second electrode (upper electrode), respectively.

However, the present embodiment is not limited thereto. The plasma generation unit 250 may generate the plasma in the discharge space using a CCP (Capacitively Coupled Plasma) source. For example, the plasma generation unit 250 may generate the plasma in the discharge space using the substrate support unit 210 and the showerhead unit 240 as the first electrode (lower electrode) and the second electrode (upper electrode), respectively. Frist, a case where the plasma generation unit 250 is embodied using the ICP source will be described, and then, a case where the plasma generation unit 250 is embodied using the CCP source will be described.

The plasma generation unit 250 may be configured to include a first high-frequency power source 251, a first transmission line 252, a second high-frequency power source 253, and a second transmission line 254.

The first high-frequency power source 251 may apply the RF power to the first electrode. The first high-frequency power source 251 may serve as a plasma source that generates plasma within the chamber housing CH. However, the present disclosure is not limited thereto. The first high-frequency power source 251 together with the second high-frequency power source 253 may serve to control the characteristics of the plasma within the chamber housing CH.

The first high-frequency power source 251 may include a plurality of first high-frequency power sources included within the substrate treating apparatus 200. In this case, the plasma generation unit 250 may include a first matching network electrically connected to each of the first high-frequency power sources. When frequency powers of different magnitudes are input from the plurality of first high-frequency power sources thereto, the first matching network may serve to match the frequency powers of different magnitudes with each other and apply the matching result to the first electrode.

The first transmission line 252 may connect the first electrode to GND. The first high-frequency power source 251 may be installed on the first transmission line 252. However, the present disclosure is not limited thereto, and the first transmission line 252 may connect the first electrode and the first high-frequency power source 251 to each other. For example, the first transmission line 252 may be embodied as an RF rod.

The second high-frequency power source 253 applies the RF power to the second electrode. The second high-frequency power source 253 may play a role in controlling the characteristics of the plasma within the chamber housing CH. For example, the second high-frequency power source 253 may play a role in controlling ion bombardment energy within the chamber housing CH.

The second high-frequency power source 253 may include a plurality of second high-frequency power sources included within the substrate treating apparatus 200. In this case, the plasma generation unit 250 may include a second matching network electrically connected to each of the second high-frequency power sources. When frequency powers of different magnitudes are input from the plurality of second high-frequency power sources thereto, the second matching network may play a role of matching the frequency powers of different magnitudes with each other and applying the matching result to the second electrode.

The second transmission line 254 connects the second electrode to GND. The second high-frequency power source 253 may be installed on the second transmission line 254.

The liner unit 260 is also defined as a wall liner and protects the inside of the chamber housing CH from arc discharge generated during the process of exciting the process gas or impurities generated during the substrate treating process. The liner unit 260 may be formed to cover an inner wall of the chamber housing CH.

The liner unit 260 may include a body 261 and a support ring 262 at an upper position of the body 261. The support ring 262 may protrude outwardly D1 from an outer surface of the body 261 and may serve to fasten the body 261 to the chamber housing CH.

The baffle unit 270 plays a role of exhausting process byproducts or unreacted gases of the plasma inside the chamber housing CH to the outside. The baffle unit 270 may be installed in the space between the substrate support unit 210 and the inner wall (or the liner unit 260) of the chamber housing CH, and may be installed adjacent to the exhaust hole 201. The baffle unit 270 may be provided in an annular ring shape and may be disposed between the substrate support unit 210 and the inner wall of the chamber housing CH.

The baffle unit 270 may include a plurality of slot holes extending through the body in the vertical direction D3 to control flow of the process gas within the chamber housing CH. The baffle unit 270 may be made of a material having etching resistance to minimize damage thereto or deformation thereof by radicals, etc. in the inner space of the chamber housing CH where the plasma is generated. For example, the baffle unit 270 may include quartz.

The window module WM serves as the upper cover of the chamber housing CH that seals the inner space of the chamber housing CH. The window module WM may be configured to be removable from the chamber housing CH. However, embodiments of the present disclosure are not limited thereto, and the window module WM may be integral with the chamber housing CH. The window module WM may be formed as a dielectric window made of an insulating material. For example, the window module WM may be made of alumina. The window module WM may include a coating film on a surface thereof to suppress the generation of particles when the plasma process is performed in the inner space of the chamber housing CH.

The antenna unit 280 generates a magnetic field and an electric field inside the chamber housing CH to excite the process gas into plasma. The antenna unit 280 may operate using the RF power supplied from the second high-frequency power source 253. The antenna unit 280 may be disposed on top of the chamber housing CH. For example, the antenna unit 280 may be disposed on the window module WM. However, the present disclosure is not limited thereto, and the antenna unit 280 may be disposed on the side wall of the chamber housing CH.

The antenna unit 280 may include a body 281, and an antenna 282 inside or on a surface of the body 281. The antenna 282 may be formed in a closed loop shape using a coil. The antenna 282 may be formed in a spiral shape or other various shapes along a width direction D1 of the chamber housing CH.

The antenna unit 280 may be formed to have a planar structure. However, the present disclosure is not limited thereto, and the antenna unit 280 may be formed to have a cylindrical structure. When the antenna unit 280 is formed to have the planar structure, the antennal unit may be disposed on top of the chamber housing CH. When the antenna unit 280 is formed to have the cylindrical structure, the antenna unit 280 may be disposed to surround the outer wall of the chamber housing CH.

Referring to FIG. 4, a case where the plasma generation unit 250 may be embodied using the ICP source has been described above. Hereinafter, referring to FIG. 5 and FIG. 6, the case where the plasma generation unit 250 is embodied using the CCP source will be described. Hereinafter, the description of duplicate contents with those of the case of FIG. 4 will be omitted, and only differences therebetween will be described.

Figure 5:
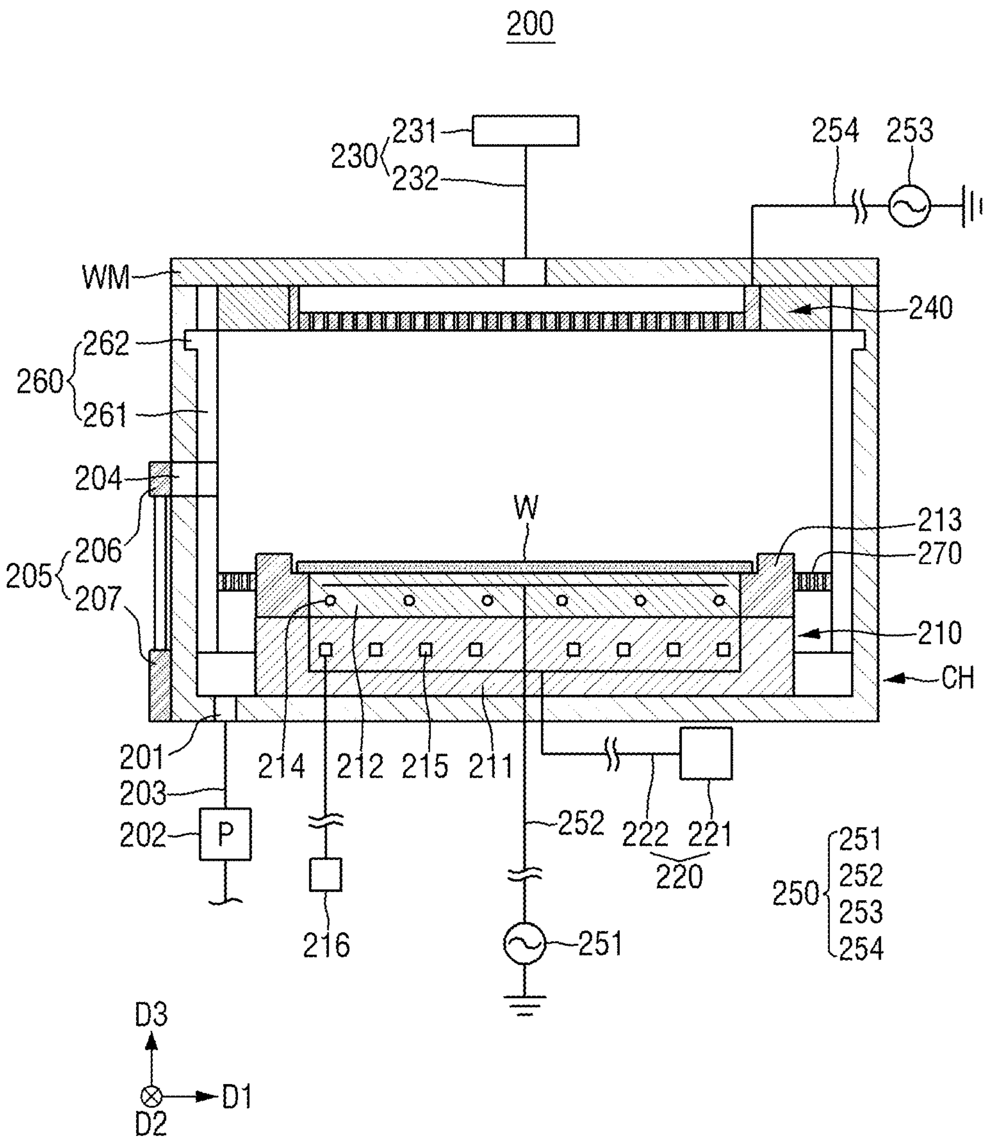
FIG. 5 is a cross-sectional view illustrating an internal structure of a substrate treating apparatus according to a second embodiment.
Figure 6:
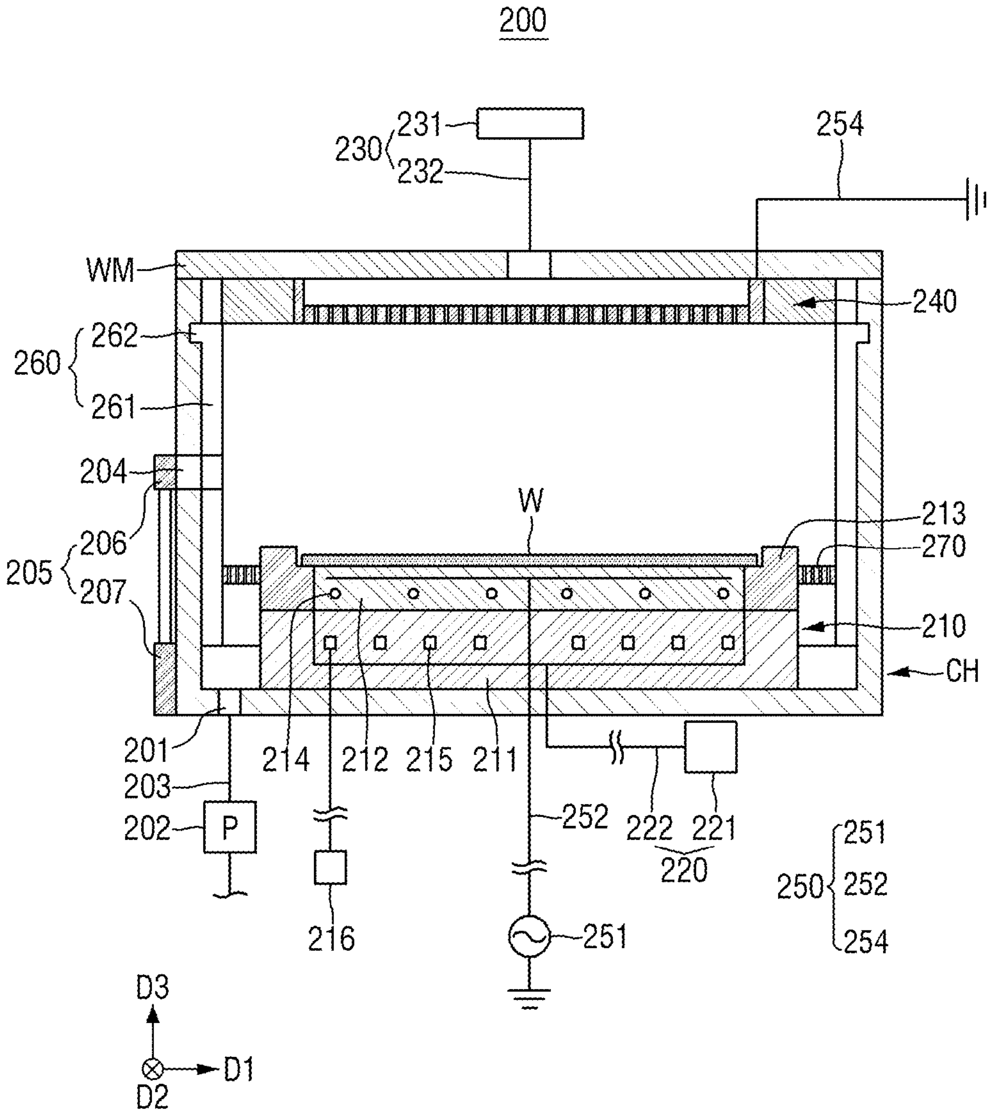
FIG. 6 is a cross-sectional view illustrating an internal structure of a substrate treating apparatus according to a third embodiment.

FIG. 5 is a cross-sectional view showing an example of an internal structure of a substrate treating apparatus according to a second embodiment. FIG. 6 is a cross-sectional view showing an example of an internal structure of a substrate treating apparatus according to a third embodiment.

According to FIG. 5 and FIG. 6, the substrate treating apparatus 200 may be configured to include a chamber housing CH, a substrate support unit 210, a cleaning gas supply unit 220, a process gas supply unit 230, a showerhead unit 240, a plasma generation unit 250, a liner unit 260, a baffle unit 270, and a window module WM.

That is, the substrate treating apparatus 200 of FIG. 5 and FIG. 6 may not include the antenna unit 280 compared to the substrate treating apparatus 200 of FIG. 4.

The plasma generation unit 250 may be configured to include the first high-frequency power source 251, the first transmission line 252, the second high-frequency power source 253, and the second transmission line 254 as shown in FIG. 5. However, the present disclosure is not limited thereto, and the plasma generation unit 250 may be configured to include the first high-frequency power source 251, the first transmission line 252, and the second transmission line 254 as shown in FIG. 6. That is, the plasma generation unit 250 of FIG. 6 may not include the second high-frequency power source 253 compared to the plasma generation unit 250 of FIG. 5.

In the example according to FIG. 4, the second transmission line 254 may be connected to the antenna 282 of the antenna unit 280. The second high-frequency power source 253 may apply the RF power to the antenna 282 of the antenna unit 280. In the example according to FIG. 5, the second transmission line 254 may be connected to the showerhead body 241. The second high-frequency power source 253 may apply the RF power to the showerhead body 241.

In the example according to FIG. 5, the second high frequency power source 253 may be installed on the second transmission line 254. In the example according to FIG. 6, the second high frequency power source 253 may not be installed on the second transmission line 254. When the second high frequency power source 253 is installed on the second transmission line 254, the plasma generation unit 250 may apply multi-frequency to the substrate treating apparatus 200.

In order to create an optimal plasma environment, various types of process gases need to be appropriately mixed with each other. In this case, it is beneficial to adjust a settling time of a mass flow controller (MFC) in consideration of characteristics based on the types of process gases. The following describes a process gas providing apparatus that may optimize the mixing between the process gases.

Figure 7:
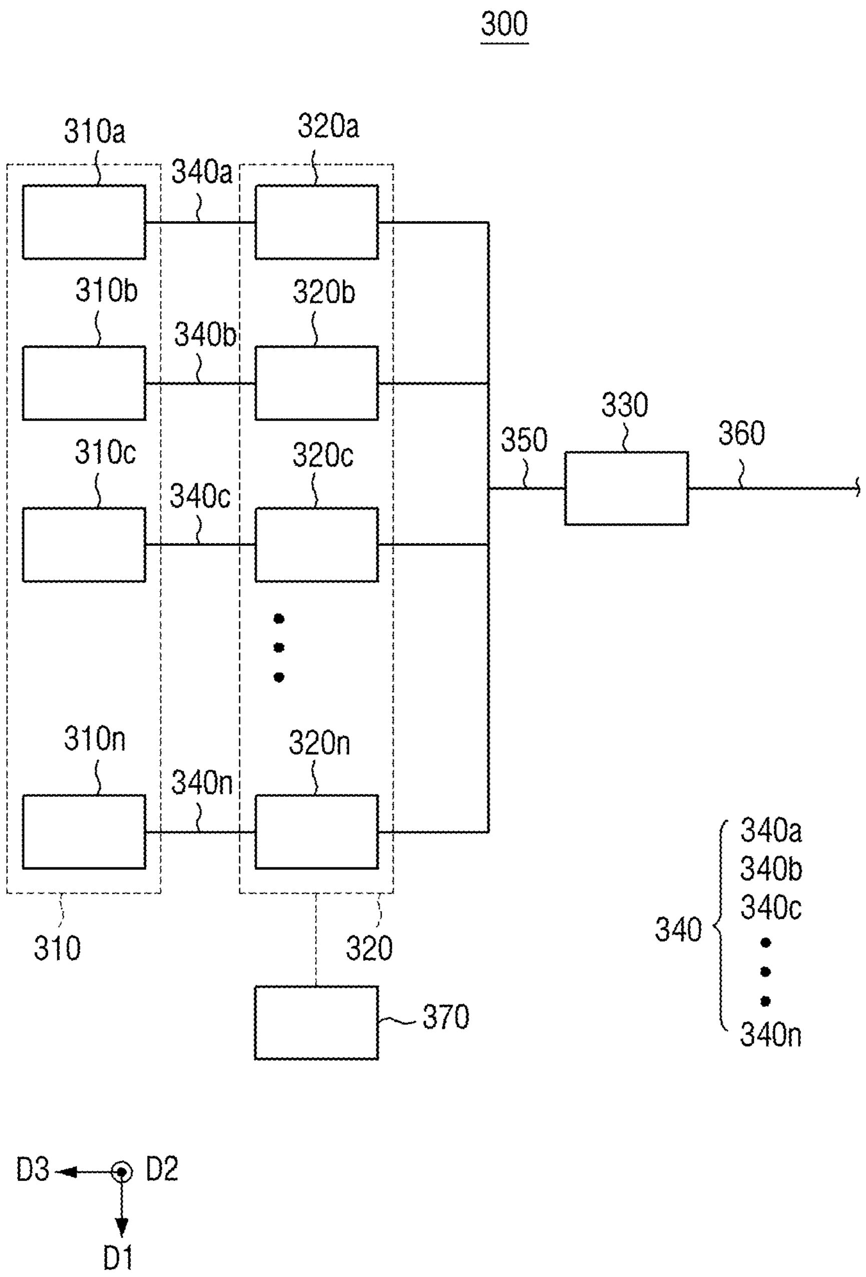
FIG. 7 is a first example diagram for illustrating an internal structure of a process gas providing apparatus according to a first embodiment of the present disclosure.

FIG. 7 is a first example diagram for illustrating an internal structure of a process gas providing apparatus according to a first embodiment of the present disclosure. A process gas providing apparatus 300 may provide various types of process gases to the process chamber 150. The process gas providing apparatus 300 may mix various types of process gases with each other and then provide the mixed gas to the process chamber 150.

As described above, the process chamber 150 may be embodied as the substrate treating apparatus 200 that treats the substrate W using plasma. That is, the process gas providing apparatus 300 may provide the mixed gas obtained by mixing various types of process gases with each other to the substrate treating apparatus 200. The process gas providing apparatus 300 may provide the mixed gas to the showerhead unit 240 of the substrate treating apparatus 200. The showerhead unit 240 may provide the mixed gas to the inner space of the chamber housing CH. The plasma generation unit 250 generates plasma using the mixed gas. Radicals generated at this time may treat the substrate W.

The process gas providing apparatus 300 may be provided as the process gas supply unit 230. That is, the process gas providing apparatus 300 may be included, as the process gas supply unit 230, in the substrate treating apparatus 200.

Referring to FIG. 7, the process gas providing apparatus 300 may be configured to include a process gas supply 310, a mass flow controller 320, a flow rate controller 330, a process gas supply line 340, a process gas carrying line 350, a process gas inflow line 360, and an MFC controller 370.

The process gas supply 310 provides a process gas to the process gas supply line 340. The process gas supply 310 may include a plurality of process gas supplies. The plurality of process gas supplies 310*a*, 310*b*, 310*c*, . . . , and 310*n* may provide different types of process gases, respectively. For example, the first process gas supply 310*a* may provide gas containing a fluorine component, and the second process gas supply 310*b* may provide gas containing a carbon component.

FIG. 7 illustrates that the number of the process gas supplies 310*a*, 310*b*, 310*c*, . . . , and 310*n* is three or greater. In this embodiment, it may suffice that the number of process gas supplies 310*a*, 310*b*, 310*c*, . . . , and 310*n* is two or greater. n may be a natural number greater than or equal to 2.

The plurality of process gas supplies 310*a*, 310*b*, 310*c*, . . . , and 310*n* may provide different types of process gases, respectively. However, the present disclosure is not limited thereto. Some process gas supplies among the plurality of process gas supplies 310*a*, 310*b*, 310*c*, . . . , and 310*n* may provide the same type of process gas. For example, the third process gas supply 310*c* may provide gas containing the same component as that of the first process gas supply 310*a*. The third process gas supply 310*c* may provide gas containing the fluorine component, just like the first process gas supply 310*a*. The third process gas supply 310*c* may operate simultaneously with the first process gas supply 310*a*. Alternatively, the third process gas supply 310*c* may operate when the first process gas supply 310*a* does not operate normally.

The mass flow controller 320 controls the process gas so that the process gas may be provided at a set flow rate. The mass flow controller 320 may be referred to as an MFC.

The mass flow controller 320 may include a plurality of mass flow controllers. The number of the plurality of mass flow controllers 320*a*, 320*b*, 320*c*, . . . , and 320*n* may be equal to the number of the plurality of process gas supplies 310*a*, 310*b*, 310*c*, . . . , and 310*n*.

When some process gas supplies among the plurality of process gas supplies 310*a*, 310*b*, 310*c*, . . . , and 310*n* provide the same type of process gas, the process gas supplies providing the same type of process gas may be connected to one mass flow controller. For example, the first process gas supply 310*a* and the third process gas supply 310*c* may be connected to the first mass flow controller 310*a*. In this case, the plurality of mass flow controllers 320*a*, 320*b*, . . . 320*n* may not include the third mass flow controller 310*c*. The number of the plurality of mass flow controllers 320*a*, 320*b*, . . . , 320*n* may be smaller than the number of the plurality of process gas supplies 310*a*, 310*b*, 310*c*, . . . , and 310*n*.

However, the present disclosure is not limited thereto. Alternatively, each process gas supply may be connected to each mass flow controller. That is, the first mass flow controller 320*a* may be connected to the first process gas supply 310*a*, and the third mass flow controller 320*c* may be connected to the third process gas supply 310*c*. In this case, the number of the plurality of mass flow controllers 320*a*, 320*b*, 320*c*, . . . , and 320*n* may be equal to the number of the plurality of process gas supplies 310*a*, 310*b*, 310*c*, . . . , and 310*n*.

After the process gases passing through the mass flow controllers 320*a*, 320*b*, 320*c*, . . . , and 320*n*, respectively, are mixed with each other to generate the mixed gas, the flow rate controller 330 is configured to control a flow rate of the mixed gas to be provided to the process chamber 150. The flow rate controller 330 may be provided as a single unit, and may be connected to all of the mass flow controller 320*a*, 320*b*, 320*c*, . . . , and 320*n*. The flow rate controller 330 may be referred to as an FRC.

The process gas supply line 340 connects to the process gas supply 310 and the mass flow controller 320 to each other. The process gas supply line 340 provides a path along which the process gas flows from the process gas supply 310 to the mass flow controller 320.

The process gas supply line 340 may include a plurality of process gas supplies 340*a*, 340*b*, 340*c*, . . . , and 340*n*. When the number of the plurality of mass flow controllers 320*a*, 320*b*, 320*c*, . . . , and 320*n* is equal to the number of the plurality of process gas supplies 310*a*, 310*b*, 310*c*, . . . , and 310*n*, each of the process gas supply lines 340*a*, 340*b*, 340*c*, . . . , and 340*n* may be connected to each of the process gas supplies 310*a*, 310*b*, 310*c*, . . . , and 310*n* and each of the mass flow controllers 320*a*, 320*b*, 320*c*, . . . , and 320*n*. When some process gas supplies provide the same type of process gas, the process gas supply line may connect the plurality of process gas supplies and a single mass flow controller to each other using a Y-shaped pipe, etc.

Each of the plurality of process gas supply lines 340*a*, 340*b*, 340*c*, . . . , and 340*n* may connect each of the plurality of process gas supplies 310*a*, 310*b*, 310*c*, . . . , and 310*n* to a front end of each of the plurality of mass flow controllers 320*a*, 320*b*, 320*c*, . . . and 320*n*. However, the present disclosure is not limited thereto. Each of the plurality of process gas supply lines 340*a*, 340*b*, 340*c*, . . . , and 340*n* may connect a back end of each of the plurality of mass flow controllers 320*a*, 320*b*, 320*c*, . . . , and 320*n* to the process gas carrying line 350.

The process gas carrying line 350 may be connected to the process gas supply line 340 connected to the back end of the mass flow controller 320. When the process gas supply line 340 includes the plurality of process gas supply lines 340*a*, 340*b*, 340*c*, . . . , and 340*n*, a combination of the plurality of process gas supply lines 340*a*, 340*b*, 340*c*, . . . , and 340*n* may be connected to a single process gas carrying line 350. The process gas carrying line 350 may guide the plurality of process gases to the flow rate controller 330 so that the plurality of process gases may be mixed with each other to generate the mixed gas.

The process gas inflow line 360 connects the flow rate controller 330 and the substrate treating apparatus 200 to each other. The process gas inflow line 360 may be connected to an opening extending through the window module WM. The mixed gas guided to the opening of the window module WM through the process gas inflow line 360 mat flow to the showerhead unit 240.

The MFC controller 370 is configured to control the mass flow controller (MFC) 320. The MFC controller 370 may be configured to control the settling time of the mass flow controller 320. The MFC controller 370 may be configured to control the settling time of the mass flow controller 320 based on the type of the process gas. The MFC controller 370 may be configured to control the settling time of the mass flow controller 320 based on a working pressure of each process gas.

The substrate treating apparatus 200 requires various types of process gases based on a process recipe. The various types of process gases may be mixed with each other to create the mixed gas before being introduced into the showerhead unit 240. In order to mix the process gases with each other, it is very important to maintain the mixing and flow uniformity of the process gases in a path from a rear end of the mass flow controller 320 to a front end of the flow rate controller 330. For this purpose, the MFC controller 370 may increase the mixing and flow uniformity between the process gases by adjusting the settling time of the mass flow controller 320 based on the type of the process gas. In accordance with the present disclosure, using this role of the MFC controller 370, an etching rate (ER) of the substrate W may be increased, and an etching rate uniformity (ER uniformity) may be obtained.

The MFC controller 370 may be connected to the mass flow controller 320 and may be configured to control the mass flow controller 320. When the mass flow controller 320 includes the plurality of MFCs, the MFC controller 370 may may be connected to control each of the mass flow controller 320*a*, 320*b*, 320*c*, . . . , and 320*n* and be configured to control each of the mass flow controllers 320*a*, 320*b*, 320*c*, . . . , and 320*n*.

Figure 8:
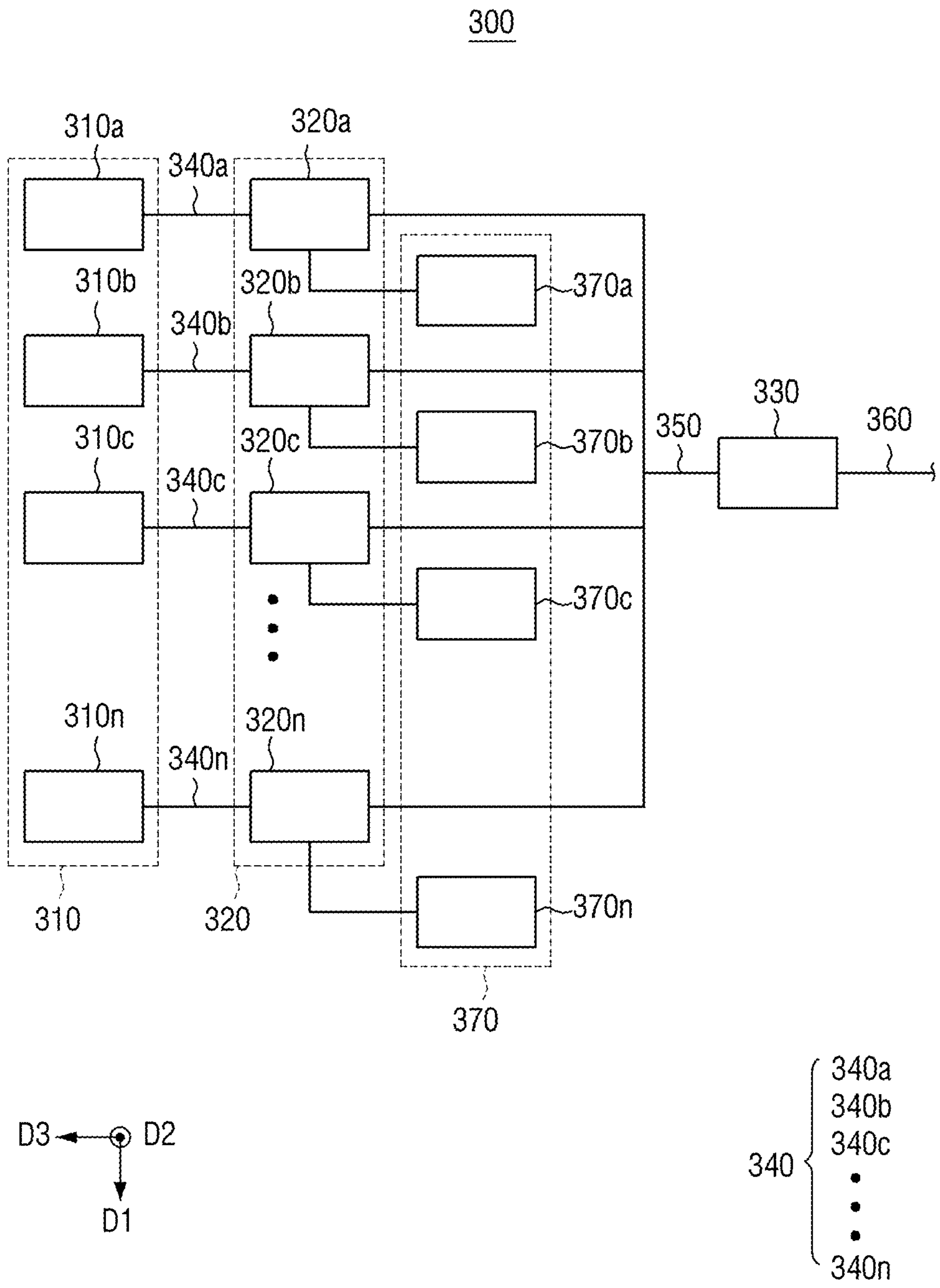
FIG. 8 is an example diagram for illustrating an internal structure of a process gas providing apparatus according to a second embodiment of the present disclosure.

However, the present disclosure is not limited thereto, and each of MFC controllers 370*a*, 370*b*, 370*c*, . . . , and 370*n* may be connected to each of the mass flow controllers 320*a*, 320*b*, 320*c*, . . . , and 320*n*. In this case, the number of the plurality of MFC controllers 370*a*, 370*b*, 370*c*, . . . , and 370*n* may be equal to the number of the plurality of mass flow controllers 320*a*, 320*b*, 320*c*, . . . , and 320*n*. FIG. 8 is an example diagram for illustrating an internal structure of the process gas providing apparatus according to a second embodiment of the present disclosure.

Figure 9:
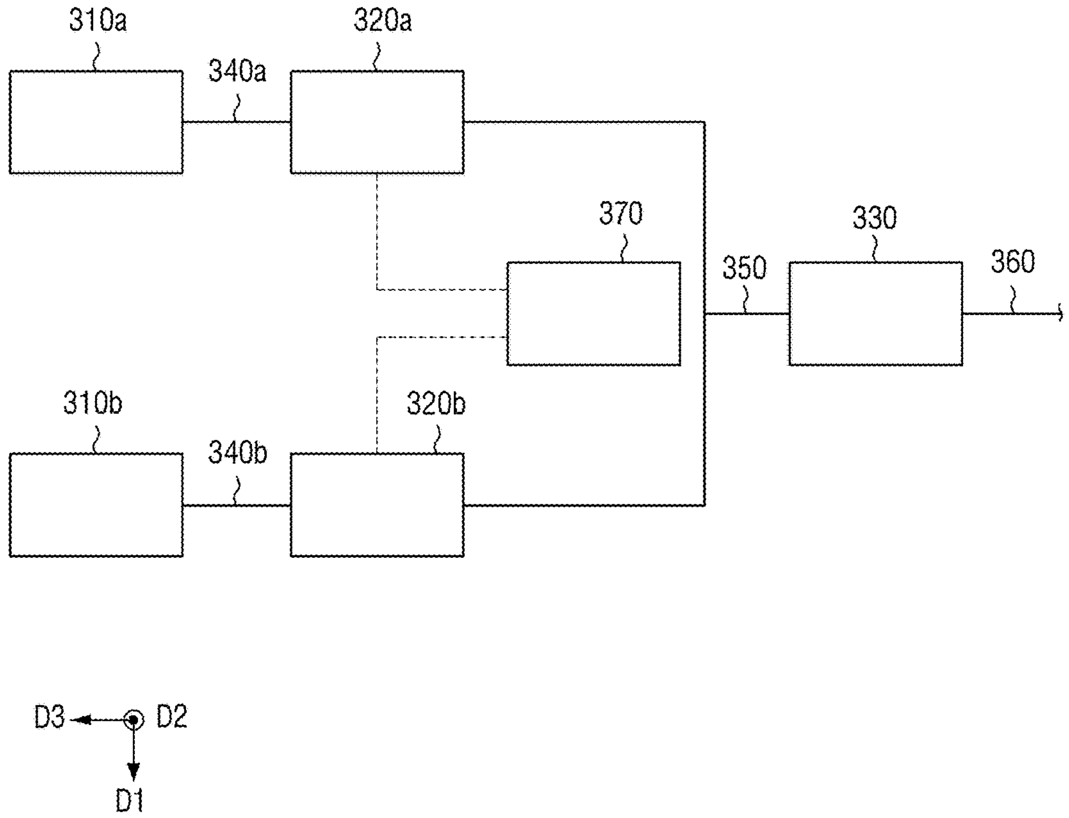
FIG. 9 is a second example diagram for illustrating an internal structure of the process gas providing apparatus according to the first embodiment of the present disclosure.

Hereinafter, an example is described in which the MFC controller 370 is configured to control the first mass flow controller 320*a* and the second mass flow controller 320*b*. The first mass flow controller 320*a* and the second mass flow controller 320*b* may provide different types of process gases, respectively. FIG. 9 is a second example diagram for illustrating an internal structure of the process gas providing apparatus according to the first embodiment of the present disclosure.

The MFC controller 370 is configured to control a settling time of the first mass flow controller 320*a*. Furthermore, the MFC controller 370 is configured to control a settling time of the second mass flow controller 320*b*.

Figure 10:
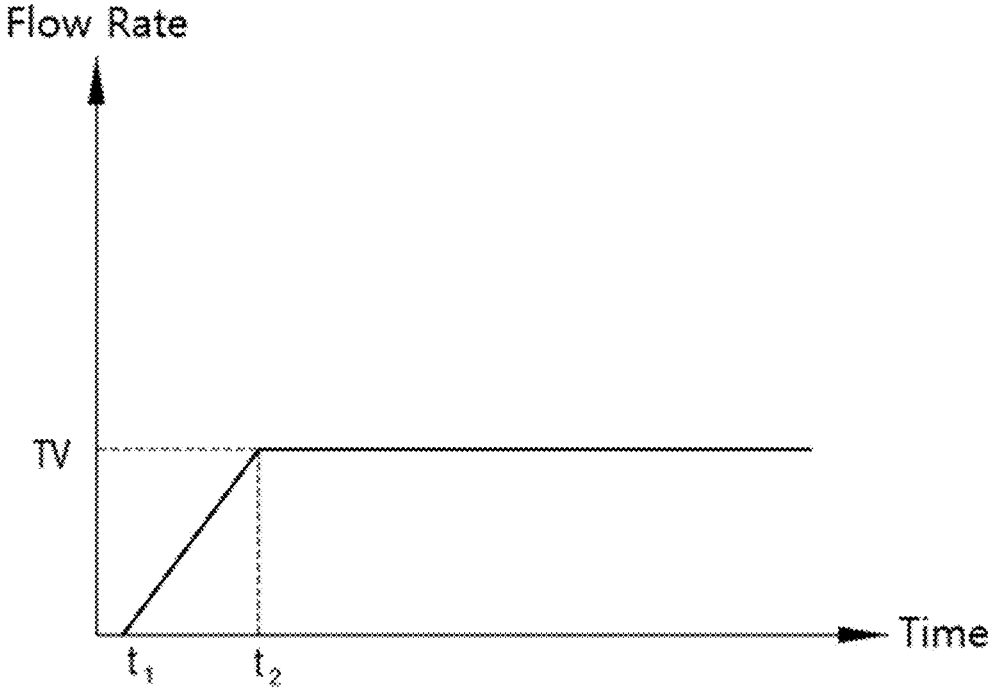
FIG. 10 is an example diagram for illustrating a settling time of a mass flow controller constituting the process gas providing apparatus of the present disclosure.

An output of the first mass flow controller 320*a* starts from a zero state (i.e., 0). Thus, it requires a certain amount of time for the first mass flow controller 320*a* to stably output a target value. An output of the second mass flow controller 320*b* starts from a zero state (i.e., 0). Thus, it requires a certain amount of time for the second mass flow controller 320*b* to stably output a target value. Referring to FIG. 10, the first mass flow controller 320*a* starts outputting at an a-th time $t_1$ and outputs a target value TV when a time reaches a b-th time $t_2$. The first mass flow controller 320*a* stably outputs the target value TV after the b-th time $t_2$. In this case, a difference value $t_1$-$t_2$ between the a-th time $t_1$ and the b-th time $t_2$ may be set as the settling time of the first mass flow controller 320*a*. The settling time of the second mass flow controller 320*b* may be set in the same manner as the manner set above with reference to the first mass flow controller 320*a*. FIG. 10 is an example diagram for illustrating a settling time of the mass flow controller constituting the process gas providing apparatus of the present disclosure.

Referring again to FIG. 9, description will be made.

The MFC controller 370 may be configured to control the settling time of each of the first mass flow controller 320*a* and the second mass flow controller 320*b* depending on the type of the process gas. For example, the MFC controller 370 may be configured to adjust the settling time of the first mass flow controller 320*a* which controls the flow rate of the first process gas to a X1 msec, and to adjust the settling time of the second mass flow controller 320*b* which controls the flow rate of the second process gas of a different type from a type of the first process gas to a Y1 msec. X1 and Y1 may be different values. X1 may be greater than Y1. Alternatively, X1 may be smaller than Y1.

When the MFC controller 370 is configured to control the settling time depending on the type of the process gas, the settling time may be controlled based on a conversion factor of the process gas. The MFC controller 370 may be configured to control the settling time to the X1 msec when the conversion factor of the process gas is greater than or equal to a reference value. The MFC controller 370 may be configured to control the settling time to the Y1 msec when the conversion factor of the process gas is smaller than the reference value. Alternatively, the MFC controller 370 may be configured to control the settling time to a X2 msec when the conversion factor of the process gas is a specific value, and be configured to control the settling time to a Y2 msec when the conversion factor of the process gas is a value other than the specific value. The specific value may be 0.5. X2 and Y2 may be different values. X2 may be smaller than Y2.

The process gas may be an etching gas. For example, the process gas may be any one of CHF3 gas, C2F6 gas, CF4 gas, C4F8 gas, C2H1F5 gas, C4F6 gas, and HF gas. The MFC controller 370 may be configured to control the settling time to the X2 msec when the process gas is C4F8 gas, C4F6 gas, or HF gas. X2 may be in a range of 10 msec to 25 msec. The MFC controller 370 may be configured to control the settling time to the Y2 msec when the process gas is CHF3 gas, C2F6 gas, CF4 gas, or C2H1F5 gas. Y2 may be in a range of 100 msec to 300 msec.

The process gas may be a deposition gas. For example, the process gas may be any one of WF6 gas, SiH4 gas, Si2H6 gas, SiH2Cl2 gas, SiH3C1 gas, and SiH(CH3)3 gas. The MFC controller 370 may be configured to control the settling time to the X2 msec when the process gas is WF6 gas. X2 may be in a range of 10 msec to 25 msec. The MFC controller 370 may be configured to control the settling time to the Y2 msec when the process gas is SiH4 gas, Si2H6 gas, SiH2Cl2 gas, SiH3C1 gas, or SiH(CH3)3 gas. Y2 may be in a range of 100 msec to 300 msec.

The MFC controller 370 may be configured to control the settling time of each of the first mass flow controller 320*a* and the second mass flow controller 320*b* based on a working pressure of the process gas. The MFC controller 370 may be configured to control the settling time to a X3 msec when the gas working pressure is higher than or equal to a reference value, and to control the settling time to a Y3 msec when the gas working pressure is lower than the reference value. Alternatively, the MFC controller 370 may be configured to control the settling time to the X3 msec when the gas working pressure is a specific value, and to the Y3 msec when the gas working pressure is a value other than the specific value. X3 and Y3 may be different values. X3 may be greater than Y3. Alternatively, X3 may be smaller than Y3.

For example, the reference value may be 10 psig (Pound-force per Square Inch Gauge pressure). The MFC controller 370 may be configured to control the settling time to the X3 msec when the gas working pressure is 10 psig or higher. The MFC controller 370 may be configured to control the settling time to the Y3 msec when the gas working pressure is lower than 10 psig. X3 may be greater than Y3. X3 may be in a range of 100 msec to 300 msec. Y3 may be in a range of 10 msec to 25 msec.

Figure 11:
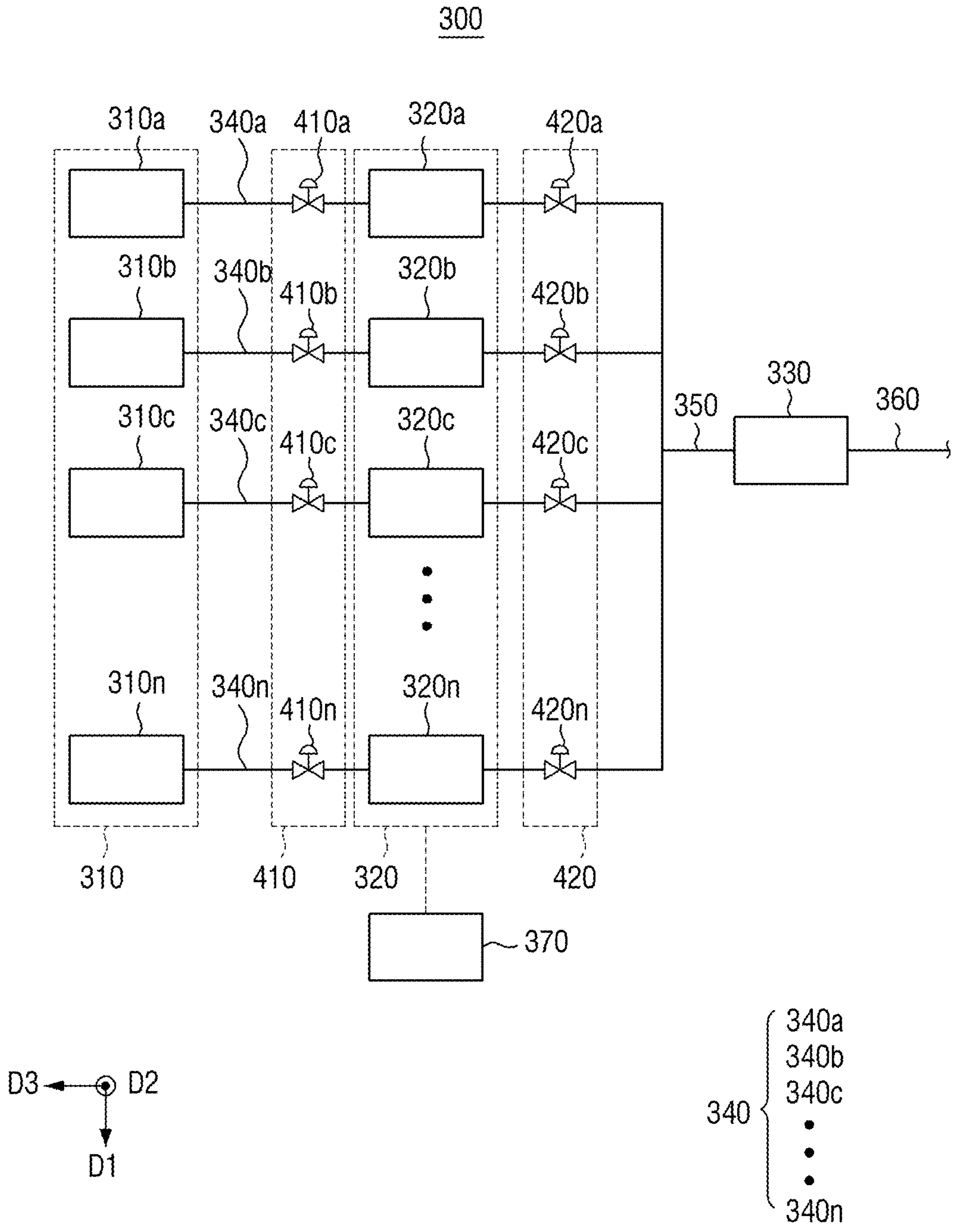
FIG. 11 is an example diagram for illustrating an internal structure of a process gas providing apparatus according to a third embodiment of the present disclosure.

The process gas providing apparatus 300 may be configured to include a first valve 410 and a second valve 420 in front and rear of the mass flow controller 320, respectively. FIG. 11 is an example diagram for illustrating an internal structure of a process gas providing apparatus according to a third embodiment of the present disclosure.

The first valve 410 may be installed in front of the mass flow controller 320. The first valve 410 may include a plurality of valves. Each of a plurality of first valves 410*a*, 410*b*, 410*c*, . . . , and 410*n* may control flow of the process gas flowing into each of the mass flow controllers 320*a*, 320*b*, 320*c*, . . . , and 320*n*. Each of the plurality of first valves 410*a*, 410*b*, 410*c*, . . . , and 410*n* may be an opening/closing valve. However, the present disclosure is not limited thereto, and each of the plurality of first valves 410*a*, 410*b*, 410*c*, . . . , and 410*n* may precisely control the flow rate of the process gas flowing into each of the mass flow controllers 320*a*, 320*b*, 320*c*, . . . , and 320*n*.

The second valve 420 may be installed in rear of the mass flow controller 320. The second valve 420 may include a plurality of valves. Each of a plurality of second valves 420*a*, 420*b*, 420*c*, . . . , and 420*n* may control flow of the process gas flowing out of each of the mass flow controllers 320*a*, 320*b*, 320*c*, . . . , and 320*n*. Each of the plurality of second valves 420*a*, 420*b*, 420*c*, . . . , and 420*n* may be an opening/closing valve. However, the present disclosure is not limited thereto, and each of the plurality of second valves 420*a*, 420*b*, 420*c*, . . . , and 420*n* may precisely control the flow rate of the process gas flowing from each of the mass flow controllers 320*a*, 320*b*, 320*c*, . . . , and 320*n* to the flow rate controller 330.

Figure 12:
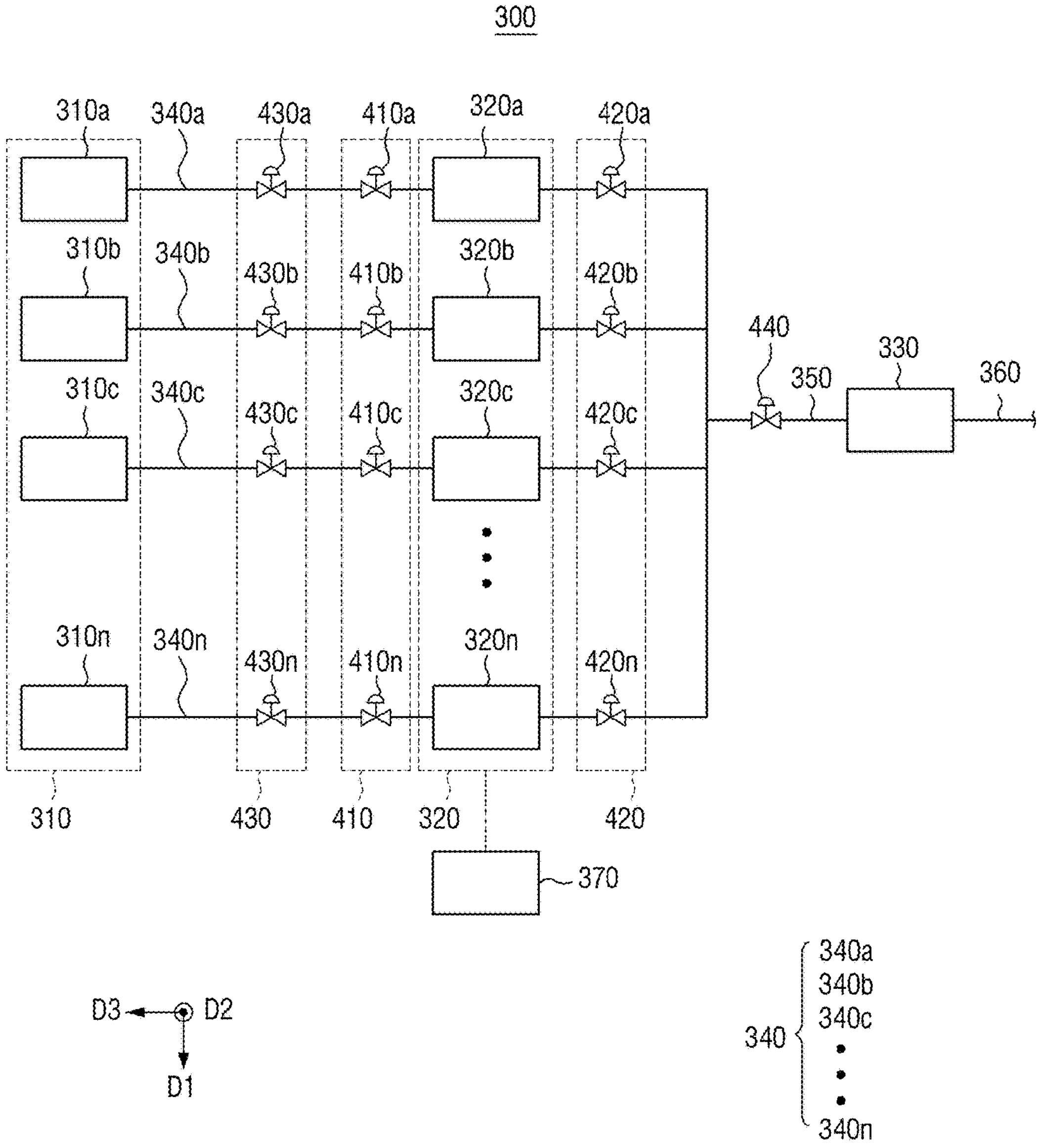
FIG. 12 is an example diagram for illustrating an internal structure of a process gas providing apparatus according to a fourth embodiment of the present disclosure.

The process gas providing apparatus 300 may further include a third valve 430 and a fourth valve 440 separately from the first valve 410 and the second valve 420 to further precisely control the flow of the process gas. FIG. 12 is an example diagram illustrating an internal structure of a process gas providing apparatus according to a fourth embodiment of the present disclosure.

The third valve 430 may be installed on the process gas supply line 340 connecting the process gas supply 310 and the mass flow controller 320 to each other in a similar manner to the first valve 410. The third valve 430 may be installed upstream of or in front of the first valve 410. The first valve 410 may be installed closer to the mass flow controller 320 than to the process gas supply 310. On the contrary, the third valve 430 may be installed closer to the process gas supply 310 than to the mass flow controller 320. The third valve 430 may include a plurality of values. A plurality of third valves 430*a*, 430*b*, 430*c*, . . . , and 430*n* may perform the same role as that of the plurality of first valves 410*a*, 410*b*, 410*c*, . . . , and 410*n*.

The fourth valve 440 may be installed on the line connecting the mass flow controller 320 and the flow rate controller 330 to each other in a similar manner to the second valve 420. The fourth valve 440 may be installed downstream of or in rear of the second valve 420. The second valve 420 may be installed closer to the mass flow controller 320 than to the flow rate controller 330. On the contrary, the fourth valve 440 may be installed closer to the flow rate controller 330 than to the mass flow controller 320.

The line connecting the mass flow controller 320 and the flow rate controller 330 to each other may include the process gas supply line 340 and the process gas carrying line 350. The plurality of process gas supply lines 340*a*, 340*b*, 340*c*, . . . , and 340*n* may be connected to a single process gas carrying line 350. The second valve 420 may be installed at the process gas supply line 340, and the fourth valve 440 may be installed at the process gas carrying line 350. However, the present disclosure is not limited thereto, and both the second valve 420 and the fourth valve 440 may be installed at the process gas supply line 340. In this case, the fourth valve 440 may include a plurality of fourth valves. The plurality of fourth valves may have the same role as that of the plurality of second valves 420*a*, 420*b*, 420*c*, . . . , and 420*n*. Alternatively, both the second valve 420 and the fourth valve 440 may be installed at the process gas carrying line 350. In this case, the fourth valve 440 may be embodied as a single valve. The second valve 420 may be embodied as a single valve in a similar manner to the fourth valve 440.

As described above, the MFC controller 370 may be configured to control the settling time of the first mass flow controller 320*a* to the X3 msec. Alternatively, the MFC controller 370 may be configured to control the settling time of the first mass flow controller 320*a* to the Y3 msec. This may be applied equally to the second mass flow controller 320*b*. Furthermore, this may be applied equally to each of the other mass flow controllers.

Figure 13:
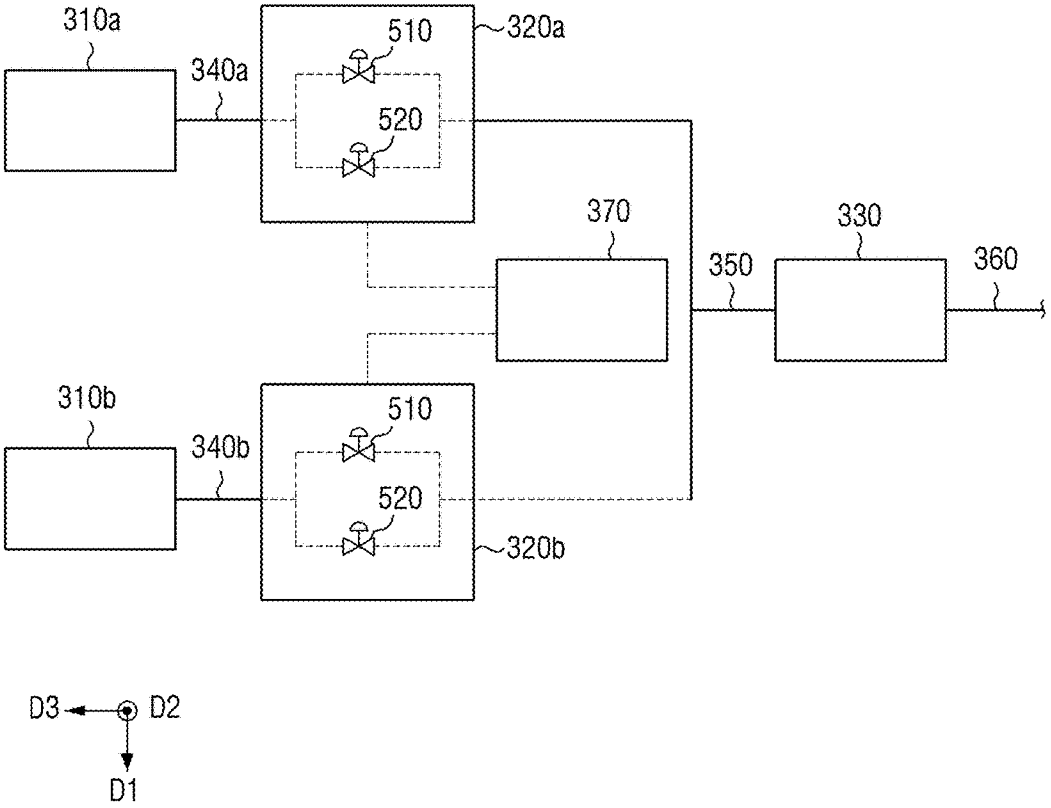
FIG. 13 is an example diagram for illustrating an internal structure of a process gas providing apparatus according to a fifth embodiment of the present disclosure.

X3 may be greater than Y3. For example, X3 may be in a range of 100 msec to 300 msec, and Y3 may be in a range of 10 msec to 25 msec. Referring to FIG. 13, the first mass flow controller 320*a* may include a high-speed piezoelectric valve 510 therein to control the settling time to the Y3 msec. The first mass flow controller 320*a* may include a low-speed piezoelectric valve 520 therein to control the settling time to the X3 msec. The high-speed piezoelectric valve 510 may operate at a speed higher than or equal to a reference value.

The low-speed piezoelectric valve 520 may operate at a speed lower than the reference value.

When a set point is applied to the first mass flow controller 320*a* according to the process recipe, the first mass flow controller 320*a* may apply the high-speed piezoelectric valve 510 such that the settling time becomes the Y3 msec. When a set point is applied to the first mass flow controller 320*a* according to the process recipe, the first mass flow controller 320*a* may apply the low-speed piezoelectric valve 520 such that the settling time becomes the X3 msec. The first mass flow controller 320*a* may operate as described above under control of the MFC controller 370. FIG. 13 is an example diagram for illustrating an internal structure of a process gas providing apparatus according to a fifth embodiment of the present disclosure.

Figure 14:
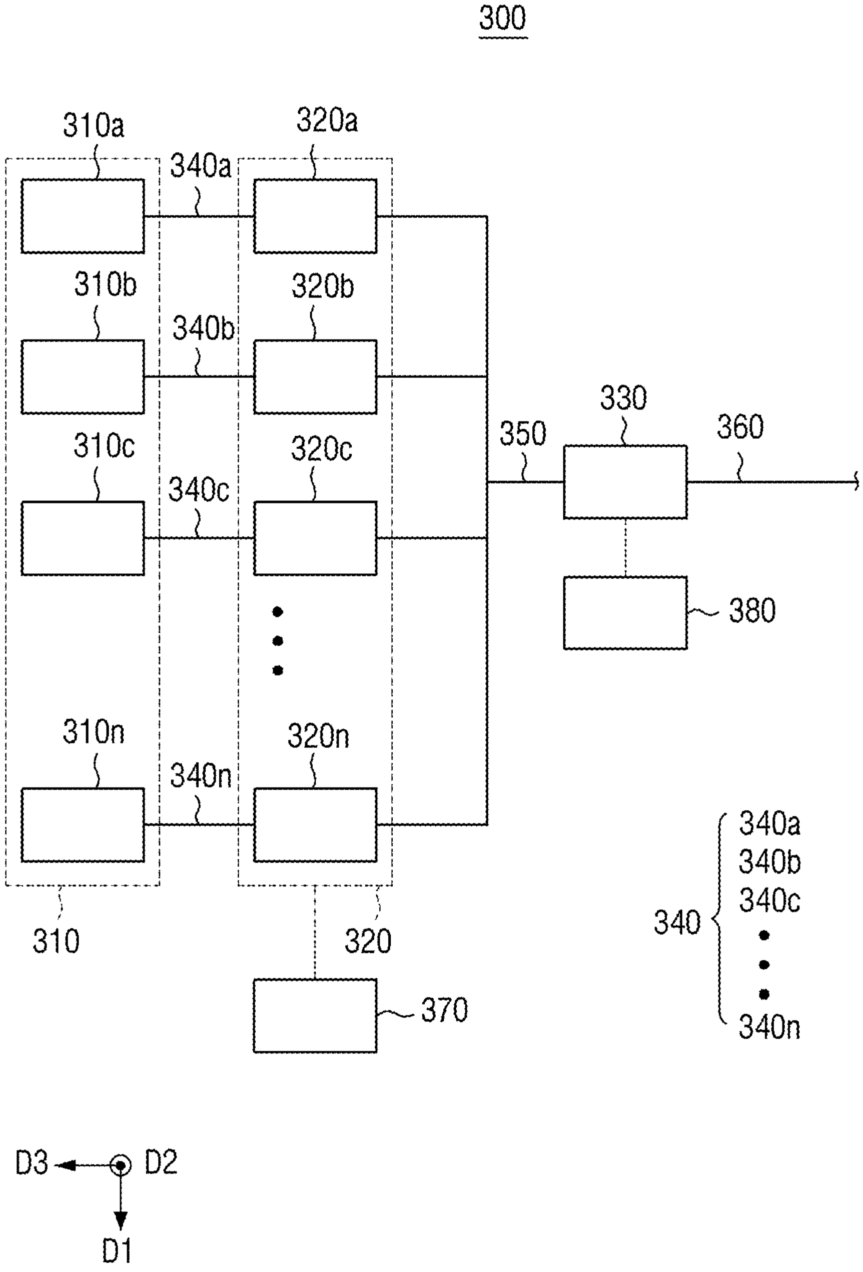
FIG. 14 is an example diagram for illustrating an internal structure of a process gas providing apparatus according to a sixth embodiment of the present disclosure.

Referring to FIG. 14, the process gas providing apparatus 300 may further include a FRC controller 380. The FRC controller 380 may be configured to control the flow rate controller (FRC) 330. FIG. 14 is an example diagram for illustrating an internal structure of the process gas providing apparatus according to a sixth embodiment of the present disclosure.

The FRC controller 380 may determine a mass flow rate of the mixed gas to be input into the substrate treating apparatus 200 using a following mathematical Equation 1. The MFC controller 370 may be configured to determine the settling time of each of the mass flow controllers 320*a*, 320*b*, 320*c*, . . . , and 320*n* as described above. The FRC controller 380 may be configured to calculate a total mass flow rate using the Equation 1 based on the settling time determined by the MFC controller 370, and to control a mass fraction of each of the process gases based on the calculated total mass flow rate.

$$\dot{m}_r = \sum_i \dot{m}_i \cdot (t_r - t_{si}) \qquad \text{Equation 1}$$

where $\dot{m}_r$ means the total mass flow rate according to the process recipe. A total flow rate of the recipe may be calculated as a sum of flow rates of the process gases flowing during the recipe time duration. In this regard, the settling times of the different process gases may be different from each other. A unit of $\dot{m}_r$ is kg/s. $\dot{m}_i$ means the mass flow rate related to each of the process gases, such as the first process gas, the second process gas, the third process gas, . . . , the n-th process gas, etc. A unit of $\dot{m}_i$ is kg/s. i means the number of process gases provided to the substrate treating apparatus 200. $t_r$ means a total recipe time taken to execute the process recipe. A unit of $t_r$ is s (sec). $t_{si}$ refers to the settling time of the mass flow controller 320 related to each process gas, such as each of the first mass flow controller 320*a*, the second mass flow controller 320*b*, the third mass flow controller 320*c*, . . . , the n-th mass flow controller 320*n*. A unit of $t_{si}$ is s (sec).

The FRC controller 380 may determine the mass flow rate of each of the process gases using a following mathematical Equation 2. When the FRC controller 380 determines the total mass flow rate using the mathematical Equation 1, the FRC controller 380 may determine the mass flow rate of each process gas using the mathematical Equation 2.

$$\dot{m}_i = A \cdot C_{qi} \cdot C_{mi} \cdot \frac{P_{up}}{\sqrt{T_{up}}} \qquad \text{Mathematical Equation 2}$$

where A represents an area size of an outlet of each of the mass flow controllers 320*a*, 320*b*, 320*c*, . . . , and 320*n*. A unit of A is $m^2$. $C_{qi}$ represents a flow coefficient of each of the process gases, such as the first process gas, the second process gas, the third process gas, . . . , the n-th process gas. $C_{mi}$ represents a mass flow parameter related to each process gas. The mass flow parameter may be a weight mass. A unit of $C_{mi}$ is $$\left[\left(\text{kg}, \frac{\text{K}}{\text{J}}\right)\right]^{1/2}.$$

represents a pressure (upstream pressure of gas i) of each process gas input to each of the mass flow controller 320*a*, 320*b*, 320*c*, . . . , and 320*n*. $P_{up}$ may be a pressure of each process gas at the MFC inlet of each of the mass flow controllers 320*a*, 320*b*, 320*c*, . . . , and 320*n*. A unit of $P_{up}$ is PaA. $T_{up}$ refers to a temperature (upstream temperature of gas i) of each process gas input into each of the mass flow controllers 320*a*, 320*b*, 320*c*, . . . , and 320*n*. $T_{up}$ may be a temperature of each process gas at the MFC inlet of each of the mass flow controllers 320*a*, 320*b*, 320*c*, . . . and 320*n*. A unit of $T_{up}$ is K.

Although embodiments of the present disclosure have been described with reference to the accompanying drawings, the present disclosure is not limited to the above embodiments, but may be implemented in various different forms. A person skilled in the art may appreciate that the present disclosure may be practiced in other concrete forms without changing the technical concepts or characteristics of the present disclosure. Therefore, it should be appreciated that the embodiments as described above is not restrictive but illustrative in all respects.

What is claimed is:

1. A substrate treating apparatus comprising:

a chamber housing having an inner space defined therein for treating a substrate therein;

a substrate support unit for supporting the substrate thereon;

a showerhead unit for injecting process gas into the inner space of the chamber housing;

a plasma generation unit for generating plasma for treating the substrate using the process gas; and a process gas providing apparatus configured to provide the process gas to the showerhead unit, wherein the process gas providing apparatus includes:

a mass flow controller (MFC) configured to control a flow rate of the process gas; and an MFC controller configured to control a settling time of the mass flow controller, wherein the MFC controller is configured to control the settling time based on a type of the process gas.

2. The substrate treating apparatus of claim 1, wherein the process gas providing apparatus includes:

a first process gas supply for providing first process gas;

a second process gas supply for providing second process gas;

a first mass flow controller connected to the first process gas supply and configured to a flow rate of the first process gas;

a second mass flow controller connected to the second process gas supply and configured to a flow rate of the second process gas;

a flow rate controller (FRC) connected to the first mass flow controller and the second mass flow controller, wherein when the first process gas and the second process gas are mixed with each other to produce mixed gas in a path between the first and second mass flow controllers and the flow rate controller, wherein the flow rate controller is configured to control a flow rate of the mixed gas and to provide the mixed gas to the showerhead unit; and the MFC controller configured to control each of a settling time of the first mass flow controller and a settling time of the second mass flow controller.

3. The substrate treating apparatus of claim 2, wherein the first process gas and the second process gas are of different types.

4. The substrate treating apparatus of claim 1, wherein the MFC controller is configured to control the settling time based on a conversion factor of the process gas.

5. The substrate treating apparatus of claim 4, wherein the MFC controller is configured to control the settling time based on whether the conversion factor is a specific value.

6. The substrate treating apparatus of claim 5, wherein the specific value is 0.5.

7. The substrate treating apparatus of claim 4, wherein the MFC controller is configured to:

control the settling time to a first time when the conversion factor is a specific value; and control the settling time to a second time when the conversion factor is not the specific value.

8. The substrate treating apparatus of claim 7, wherein the first time is smaller than the second time.

9. The substrate treating apparatus of claim 1, wherein the MFC controller is configured to control the settling time based on a working pressure of the process gas.

10. The substrate treating apparatus of claim 9, wherein the MFC controller is configured to control the settling time based on whether the working pressure is higher than or equal to a reference value.

11. The substrate treating apparatus of claim 10, wherein the reference value is 10 psig.

12. The substrate treating apparatus of claim 9, wherein the MFC controller is configured to:

control the settling time to a first time when the working pressure is higher than or equal to the reference value; and control the settling time to a second time when the working pressure is lower than the reference value.

13. The substrate treating apparatus of claim 12, wherein the first time is larger than the second time.

14. The substrate treating apparatus of claim 1, wherein the mass flow controller includes:

a first piezoelectric valve configured to control the settling time to a first time; and a second piezoelectric valve configured to control the settling time to a second time.

15. The substrate treating apparatus of claim 14, wherein the first time is smaller than the second time.

16. The substrate treating apparatus of claim 2, wherein the process gas providing apparatus further includes:

an FRC controller configured to:

determine a mass flow rate of the mixed gas to be input into the showerhead unit based on a process recipe, and control the flow rate controller (FRC) based on the determined mass flow rate.

17. The substrate treating apparatus of claim 16, wherein the FRC controller is configured to determine the mass flow rate of the mixed gas, based on the number of process gases to be provided to the showerhead unit, a mass flow rate of the first process gas, a mass flow rate of the second process gas, a time taken to complete the process recipe, the settling time of the first mass flow controller, and the settling time of the second mass flow controller.

18. The substrate treating apparatus of claim 17, wherein the FRC controller is configured to determine the mass flow rate of the first process gas, based on an area size of an outlet of the first mass flow controller, a flow coefficient of the first process gas, a weight mass of the first process gas, a pressure of the first process gas when the first process gas flows into the first mass flow controller, and a temperature of the first process gas when the first process gas flows into the first mass flow controller.

19. A process gas providing apparatus for providing process gas to a substrate treating apparatus for treating a substrate using plasma, wherein the process gas providing apparatus comprises:

a first process gas supply for providing first process gas;

a second process gas supply for providing second process gas;

a first mass flow controller (MFC) connected to the first process gas supply and configured to a flow rate of the first process gas;

a second mass flow controller connected to the second process gas supply and configured to a flow rate of the second process gas;

a flow rate controller (FRC) connected to the first mass flow controller and the second mass flow controller, wherein when the first process gas and the second process gas are mixed with each other to produce mixed gas in a path between the first and second mass flow controllers and the flow rate controller, wherein the flow rate controller is configured to control a flow rate of the mixed gas and to provide the mixed gas to the substrate treating apparatus; and a MFC controller configured to control each of a settling time of the first mass flow controller and a settling time of the second mass flow controller, wherein the MFC controller is configured to control the settling time of each of the first and second MFCs, based on a type of each of the first and second process gases.

20. A substrate treating apparatus comprising:

a chamber housing having an inner space defined therein for treating a substrate therein;

a substrate support unit for supporting the substrate thereon;

a showerhead unit for injecting process gas into the inner space of the chamber housing;

a plasma generation unit for generating plasma for treating the substrate using the process gas; and a process gas providing apparatus configured to provide the process gas to the showerhead unit, wherein the process gas providing apparatus includes:

a first process gas supply for providing first process gas;

a second process gas supply for providing second process gas;

a first mass flow controller (MFC) connected to the first process gas supply and configured to a flow rate of the first process gas;

a second mass flow controller connected to the second process gas supply and configured to a flow rate of the second process gas;

a flow rate controller (FRC) connected to the first mass flow controller and the second mass flow controller, wherein when the first process gas and the second process gas are mixed with each other to produce mixed gas in a path between the first and second mass flow controllers and the flow rate controller, wherein the flow rate controller is configured to control a flow rate of the mixed gas and to provide the mixed gas to the showerhead unit; and a MFC controller configured to control each of a settling time of the first mass flow controller and a settling time of the second mass flow controller, wherein the MFC controller is configured to control the settling time of each of the first and second MFCs, based on at least one among a type of each of the first and second process gases, a conversion factor of the process gas, and a working pressure of the process gas, wherein the first mass flow controller includes:

a first piezoelectric valve for controlling the settling time to a first time; and a second piezoelectric valve for controlling the settling time to a second time.

* * * * *